(12) United States Patent
Crockett et al.

(10) Patent No.: US 12,301,189 B2
(45) Date of Patent: *May 13, 2025

(54) AUDIO CONTROL USING AUDITORY EVENT DETECTION

(71) Applicant: Dolby Laboratories Licensing Corporation, San Francisco, CA (US)

(72) Inventors: Brett G. Crockett, Brisbane, CA (US); Alan J. Seefeldt, Alameda, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/672,224

(22) Filed: May 23, 2024

(65) Prior Publication Data

US 2024/0313729 A1    Sep. 19, 2024

Related U.S. Application Data

(60) Continuation of application No. 18/436,667, filed on Feb. 8, 2024, now Pat. No. 12,218,642, which is a
(Continued)

(51) Int. Cl.
*H04R 29/00*   (2006.01)
*G10L 21/038*  (2013.01)
(Continued)

(52) U.S. Cl.
CPC ......... *H03G 3/3005* (2013.01); *G10L 21/038* (2013.01); *G10L 25/21* (2013.01);
(Continued)

(58) Field of Classification Search
CPC ........ H04R 29/00; H03G 1/0088; H03G 3/00; H03G 3/001; H03G 3/002; H03G 3/04;
(Continued)

(56) References Cited

U.S. PATENT DOCUMENTS 2,808,475 A   10/1957   Stryker
4,281,218 A    7/1981   Chuang et al.
(Continued)

FOREIGN PATENT DOCUMENTS

DE   4335739 A1    5/1994
DE  19848491 A1    4/2000
(Continued)

OTHER PUBLICATIONS

ISO/IEC 14496-3 "Information Technology—Coding of Audio-Visual Objects" Part 3: Audio, Third Edition Dec. 1, 2005.
(Continued)

*Primary Examiner* — Xu Mei

(57) ABSTRACT

In some embodiments, a method for processing an audio signal in an audio processing apparatus is disclosed. The method includes receiving an audio signal and a parameter, the parameter indicating a location of an auditory event boundary. An audio portion between consecutive auditory event boundaries constitutes an auditory event. The method further includes applying a modification to the audio signal based in part on an occurrence of the auditory event. The parameter may be generated by monitoring a characteristic of the audio signal and identifying a change in the characteristic.

7 Claims, 8 Drawing Sheets

Related U.S. Application Data continuation of application No. 18/327,585, filed on Jun. 1, 2023, now Pat. No. 11,962,279, which is a continuation of application No. 17/839,099, filed on Jun. 13, 2022, now Pat. No. 11,711,060, which is a continuation of application No. 17/093,178, filed on Nov. 9, 2020, now Pat. No. 11,362,631, which is a continuation of application No. 16/729,468, filed on Dec. 29, 2019, now Pat. No. 10,833,644, which is a division of application No. 16/365,947, filed on Mar. 27, 2019, now Pat. No. 10,523,169, which is a continuation of application No. 16/128,642, filed on Sep. 12, 2018, now Pat. No. 10,284,159, which is a continuation of application No. 15/809,413, filed on Nov. 10, 2017, now Pat. No. 10,103,700, which is a continuation of application No. 15/447,564, filed on Mar. 2, 2017, now Pat. No. 9,866,191, which is a continuation of application No. 15/238,820, filed on Aug. 17, 2016, now Pat. No. 9,685,924, which is a continuation of application No. 13/850,380, filed on Mar. 26, 2013, now Pat. No. 9,450,551, which is a continuation of application No. 13/464,102, filed on May 4, 2012, now Pat. No. 8,428,270, which is a continuation of application No. 13/406,929, filed on Feb. 28, 2012, now Pat. No. 9,136,810, which is a continuation of application No. 12/226,698, filed as application No. PCT/US2007/008313 on Mar. 30, 2007, now Pat. No. 8,144,881.

(60) Provisional application No. 60/795,808, filed on Apr. 27, 2006.

(51) Int. Cl.

| | |
|---|---|
| *G10L 25/21* | (2013.01) |
| *G10L 25/51* | (2013.01) |
| *H03G 1/00* | (2006.01) |
| *H03G 3/30* | (2006.01) |
| *H03G 5/00* | (2006.01) |
| *H03G 7/00* | (2006.01) |
| *H03G 9/00* | (2006.01) |
| *H04R 3/00* | (2006.01) |
| *H04R 3/04* | (2006.01) |

(52) U.S. Cl.
CPC .............. *G10L 25/51* (2013.01); *H03G 1/00* (2013.01); *H03G 3/3089* (2013.01); *H03G 7/007* (2013.01); *H03G 9/005* (2013.01); *H04R 3/00* (2013.01); *H04R 3/04* (2013.01); *H04R 2430/03* (2013.01)

(58) Field of Classification Search
CPC ...... H03G 3/32; H03G 3/3005; H03G 3/3089; H03G 7/007; H03G 9/005
USPC ...... 381/56, 80, 81, 94.1–94.3, 98, 101–107
See application file for complete search history.

(56) References Cited

U.S. PATENT DOCUMENTS

| | | |
|---|---|---|
| 4,543,537 A | 9/1985 | Kuhn et al. |
| 4,624,009 A | 11/1986 | Glenn et al. |
| 4,739,514 A | 4/1988 | Short et al. |
| 4,882,762 A | 11/1989 | Waldhauer |
| 4,887,299 A | 12/1989 | Cummins et al. |
| 5,027,410 A | 6/1991 | Williamson et al. |
| 5,097,510 A | 3/1992 | Graupe |
| 5,172,358 A | 12/1992 | Kimura |
| 5,278,912 A | 1/1994 | Waldhauer |
| 5,363,147 A | 11/1994 | Joseph et al. |
| 5,369,711 A | 11/1994 | Williamson, III |
| 5,377,277 A | 12/1994 | Bisping |
| RE34,961 E | 6/1995 | Widin et al. |
| 5,457,769 A | 10/1995 | Valley |
| 5,463,695 A | 10/1995 | Werrbach |
| 5,500,902 A | 3/1996 | Stockham, Jr. et al. |
| 5,530,760 A | 6/1996 | Paisley |
| 5,548,538 A | 8/1996 | Grace et al. |
| 5,583,962 A | 12/1996 | Davis et al. |
| 5,615,270 A | 3/1997 | Miller et al. |
| 5,632,005 A | 5/1997 | Davis et al. |
| 5,633,981 A | 5/1997 | Davis |
| 5,649,060 A | 7/1997 | Ellozy et al. |
| 5,663,727 A | 9/1997 | Vokac |
| 5,682,463 A | 10/1997 | Allen et al. |
| 5,712,954 A | 1/1998 | Dezonno |
| 5,724,433 A | 3/1998 | Engebretson et al. |
| 5,727,119 A | 3/1998 | Davidson et al. |
| 5,819,247 A | 10/1998 | Freund et al. |
| 5,848,171 A | 12/1998 | Stockham, Jr. et al. |
| 5,862,228 A | 1/1999 | Davis |
| 5,878,391 A | 3/1999 | Aarts |
| 5,907,622 A | 5/1999 | Dougherty |
| 5,909,664 A | 6/1999 | Davis et al. |
| 6,002,776 A | 12/1999 | Bhadkamkar et al. |
| 6,002,966 A | 12/1999 | Loeb et al. |
| 6,021,386 A | 2/2000 | Davis et al. |
| 6,041,295 A | 3/2000 | Hinderks |
| 6,061,647 A | 5/2000 | Barrett |
| 6,088,461 A | 7/2000 | Lin et al. |
| 6,094,489 A | 7/2000 | Ishige et al. |
| 6,108,431 A | 8/2000 | Bachler |
| 6,125,343 A | 9/2000 | Schuster |
| 6,148,085 A | 11/2000 | Jung |
| 6,182,033 B1 | 1/2001 | Accardi et al. |
| 6,185,309 B1 | 2/2001 | Attias |
| 6,233,554 B1 | 5/2001 | Heimbigner et al. |
| 6,240,388 B1 | 5/2001 | Fukuchi |
| 6,263,371 B1 | 7/2001 | Geagan, III et al. |
| 6,272,360 B1 | 8/2001 | Yamaguchi et al. |
| 6,275,795 B1 | 8/2001 | Tzirkel-Hancock |
| 6,298,139 B1 | 10/2001 | Poulsen et al. |
| 6,301,555 B2 | 10/2001 | Hinderks |
| 6,311,155 B1 | 10/2001 | Vaudrey et al. |
| 6,314,396 B1 | 11/2001 | Monkowski |
| 6,327,366 B1 | 12/2001 | Uvacek et al. |
| 6,332,119 B1 | 12/2001 | Hinderks |
| 6,351,731 B1 | 2/2002 | Anderson et al. |
| 6,351,733 B1 | 2/2002 | Saunders et al. |
| 6,353,671 B1 | 3/2002 | Kandel et al. |
| 6,370,255 B1 | 4/2002 | Schaub et al. |
| 6,411,927 B1 | 6/2002 | Morin et al. |
| 6,430,533 B1 | 8/2002 | Kolluru et al. |
| 6,442,278 B1 | 8/2002 | Vaudrey et al. |
| 6,442,281 B2 | 8/2002 | Sato et al. |
| 6,473,731 B2 | 10/2002 | Hinderks |
| 6,498,855 B1 | 12/2002 | Kokkosoulis et al. |
| 6,529,605 B1 | 3/2003 | Christoph |
| 6,570,991 B1 | 5/2003 | Scheirer et al. |
| 6,625,433 B1 | 9/2003 | Poirier et al. |
| 6,639,989 B1 | 10/2003 | Zacharov et al. |
| 6,650,755 B2 | 11/2003 | Vaudrey et al. |
| 6,651,040 B1 | 11/2003 | Bakis |
| 6,651,041 B1 | 11/2003 | Juric |
| 6,700,982 B1 | 3/2004 | Geurts et al. |
| 6,731,767 B1 | 5/2004 | Blamey |
| 6,807,525 B1 | 10/2004 | Li et al. |
| 6,823,303 B1 | 11/2004 | Su et al. |
| 6,889,186 B1 | 5/2005 | Michaelis |
| 6,958,644 B2 | 10/2005 | Palaskas |
| 6,985,594 B1 | 1/2006 | Vaudrey et al. |
| 7,065,498 B1 | 6/2006 | Thomas et al. |
| 7,068,723 B2 | 6/2006 | Foote et al. |
| 7,095,860 B1 | 8/2006 | Kemp |
| 7,155,385 B2 | 12/2006 | Berestesky et al. |
| 7,171,272 B2 | 1/2007 | Blamey et al. |
| 7,212,640 B2 | 5/2007 | Bizjak |
| 7,283,954 B2 | 10/2007 | Crockett |

(56) References Cited

U.S. PATENT DOCUMENTS

| | | | |
|---|---|---|---|
| 7,454,331 | B2 | 11/2008 | Vinton |
| 7,461,002 | B2 | 12/2008 | Crockett |
| 7,508,947 | B2 | 3/2009 | Smithers |
| 7,551,745 | B2 | 6/2009 | Gundry |
| 7,610,205 | B2 | 10/2009 | Crockett |
| 7,617,109 | B2 | 11/2009 | Smithers |
| 7,711,123 | B2 | 5/2010 | Crockett |
| 8,054,948 | B1 | 11/2011 | Gailloux |
| 8,090,120 | B2 | 1/2012 | Seefeldt |
| 8,144,881 | B2 | 3/2012 | Crockett |
| 8,230,243 | B2 | 7/2012 | Fujiwara |
| 9,774,309 | B2 * | 9/2017 | Crockett ............... G10L 25/51 |
| 9,780,751 | B2 * | 10/2017 | Crockett ............. H03G 3/3005 |
| 9,787,268 | B2 * | 10/2017 | Crockett ............. H03G 3/3005 |
| 9,787,269 | B2 * | 10/2017 | Crockett ............. H03G 3/3005 |
| 9,866,191 | B2 * | 1/2018 | Crockett ............... H03G 7/007 |
| 10,103,700 | B2 * | 10/2018 | Crockett ............... H03G 9/005 |
| 10,284,159 | B2 | 5/2019 | Crockett |
| 10,523,169 | B2 * | 12/2019 | Crockett ............... H03G 9/005 |
| 10,833,644 | B2 * | 11/2020 | Crockett ................. H03G 1/00 |
| 11,362,631 | B2 | 6/2022 | Crockett |
| 11,711,060 | B2 * | 7/2023 | Crockett ............. H03G 3/3005 381/104 |
| 11,962,279 | B2 * | 4/2024 | Crockett ................. H03G 1/00 |
| 2001/0027393 | A1 | 10/2001 | Touimi et al. |
| 2001/0038643 | A1 | 11/2001 | McParland |
| 2002/0013698 | A1 | 1/2002 | Vaudrey et al. |
| 2002/0040295 | A1 | 4/2002 | Saunders et al. |
| 2002/0051546 | A1 | 5/2002 | Bizjak |
| 2002/0076072 | A1 | 6/2002 | Cornelisse |
| 2002/0097882 | A1 | 7/2002 | Greenberg et al. |
| 2002/0146137 | A1 | 10/2002 | Kuhnel et al. |
| 2002/0147595 | A1 | 10/2002 | Baumgarte |
| 2002/0173864 | A1 | 11/2002 | Smith |
| 2003/0002683 | A1 | 1/2003 | Vaudrey et al. |
| 2003/0035549 | A1 | 2/2003 | Bizjak et al. |
| 2003/0223597 | A1 | 12/2003 | Puria et al. |
| 2004/0013272 | A1 | 1/2004 | Reams |
| 2004/0024591 | A1 | 2/2004 | Boillot et al. |
| 2004/0037421 | A1 | 2/2004 | Truman |
| 2004/0042617 | A1 | 3/2004 | Beerends et al. |
| 2004/0044525 | A1 | 3/2004 | Vinton et al. |
| 2004/0076302 | A1 | 4/2004 | Christoph |
| 2004/0122662 | A1 | 6/2004 | Crockett |
| 2004/0148159 | A1 | 7/2004 | Crockett et al. |
| 2004/0165730 | A1 | 8/2004 | Crockett |
| 2004/0172240 | A1 | 9/2004 | Crockett et al. |
| 2004/0184537 | A1 | 9/2004 | Geiger et al. |
| 2004/0190740 | A1 | 9/2004 | Chalupper et al. |
| 2004/0213420 | A1 | 10/2004 | Gundry et al. |
| 2005/0013443 | A1 | 1/2005 | Marumoto |
| 2005/0027766 | A1 | 2/2005 | Ben |
| 2005/0267744 | A1 | 12/2005 | Nettre |
| 2005/0276425 | A1 | 12/2005 | Forrester et al. |
| 2006/0002572 | A1 | 1/2006 | Smithers et al. |
| 2006/0029239 | A1 | 2/2006 | Smithers |
| 2006/0126865 | A1 | 6/2006 | Blamey |
| 2006/0182290 | A1 | 8/2006 | Yano |
| 2006/0215852 | A1 | 9/2006 | Troxel |
| 2007/0258603 | A1 | 11/2007 | Avendano |
| 2007/0274538 | A1 | 11/2007 | Van Reck |
| 2007/0291959 | A1 | 12/2007 | Seefeldt |
| 2009/0161883 | A1 | 6/2009 | Katsianos |
| 2009/0220109 | A1 | 9/2009 | Crockett et al. |
| 2012/0163629 | A1 | 6/2012 | Seefeldt |
| 2012/0321096 | A1 | 12/2012 | Crockett et al. |
| 2014/0376729 | A1 | 12/2014 | Crockett |
| 2024/0186972 | A1 * | 6/2024 | Crockett ............... G10L 25/51 |

FOREIGN PATENT DOCUMENTS

| | | |
|---|---|---|
| DE | 1736966 U | 11/2007 |
| EP | 0517233 B1 | 12/1992 |
| EP | 0525544 B1 | 2/1993 |
| EP | 0637011 B1 | 2/1995 |
| EP | 0661905 B1 | 10/1995 |
| EP | 0746116 B1 | 12/1996 |
| EP | 1239269 A1 | 9/2002 |
| EP | 1251715 B1 | 10/2002 |
| EP | 1387487 A2 | 2/2004 |
| EP | 1601171 A1 | 11/2005 |
| EP | 1628397 A1 | 2/2006 |
| EP | 1736966 B1 | 11/2007 |
| FR | 2820573 A1 | 8/2002 |
| JP | 10074097 A | 7/1996 |
| JP | 2004527000 A | 9/2004 |
| JP | 2004528601 A | 9/2004 |
| JP | 2004356894 A | 12/2004 |
| KR | 940003351 B1 | 4/1994 |
| SU | 720691 A1 | 3/1980 |
| TW | 318926 B | 11/1997 |
| TW | 563094 B | 11/2003 |
| WO | 1998020482 A1 | 5/1998 |
| WO | 1998027543 A2 | 6/1998 |
| WO | 1999029114 A1 | 6/1999 |
| WO | 2000019414 A1 | 4/2000 |
| WO | 2000078093 A1 | 12/2000 |
| WO | 2002017678 A1 | 2/2002 |
| WO | WO0215587 A2 | 2/2002 |
| WO | 2003090208 A1 | 10/2003 |
| WO | 2004019656 A2 | 3/2004 |
| WO | 2004073178 A2 | 8/2004 |
| WO | 2004111994 A2 | 12/2004 |
| WO | 2005086139 A1 | 9/2005 |
| WO | 2005104360 A1 | 11/2005 |
| WO | 2006003536 A1 | 1/2006 |
| WO | 2006006977 A1 | 1/2006 |
| WO | 2006019719 A1 | 2/2006 |
| WO | 2006047600 A1 | 5/2006 |
| WO | 2006058361 A1 | 6/2006 |
| WO | 2006113047 A1 | 10/2006 |
| WO | 2006113062 A1 | 10/2006 |
| WO | 2007016107 A2 | 2/2007 |
| WO | 2007120452 A1 | 10/2007 |
| WO | 2007120453 A1 | 10/2007 |
| WO | 2007123608 A1 | 11/2007 |
| WO | 2007127023 A1 | 11/2007 |
| WO | 2008051347 A2 | 5/2008 |
| WO | 2008057173 A1 | 5/2008 |
| WO | 2008085330 A1 | 7/2008 |
| WO | 2008115445 A1 | 9/2008 |
| WO | 2008156774 A1 | 12/2008 |

OTHER PUBLICATIONS

Robinson, et a., Dynamic Range Control via Metadata, 107.sup.th Convention of the AES, Sep. 14-27, 1999, New York.

Robinson, et al., "Time-Domain Auditory Model for the Assessment of High-Quality Coded Audio," 107.sup.th AES Convention, Sep. 1999.

Saunders, "Real-Time Discrimination of Broadcast Speech/Music," Proc. of Int. Conf. on Acoust. Speech and Sig. Proce., 1996, pp. 993-996.

Schapire, "A Brief Introduction to Boosting," Proc. of the 16.sup.th Int. Joint Conference on Artificial Intelligence, 1999.

Scheirer and Slaney, "Construction and Evaluation of a robust Multifeature Speech/Music Discriminator," Proc. of Int. Conf. on Acoust. Speech and Sig. Proc., 1997, pp. 1331-1334.

Seefeldt, et al.; "A New Objective Measure of Perceived Loudness," Audio Engineering Society (AES) 117.sup.th Convention, Paper 6236, Oct. 28-31, 2004, San Francisco, CA, pp. 1-8.

Seo, et al., "Auditory Model Design for Objective Audio Quality Measurement," Department of Electronic Engineering, Dongguk University, Seoul Korea.

Smith, et al., "Tandem-Free VoIP Conferencing: A Bridge to Next-Generation Networks," IEEE Communications Magazine, IEEE Service Center, New York, NY, vol. 41, No. 5, May 2003, pp. 136-145.

Smith, Michael Talbot, "Audio Engineer's Reference Book" 2nd Edition, Section 2.9 "Limiters and Compressors" by Alan Tutton, p. 2.149-2.165, Focal Press, Reed Educational and Professional Publishing Ltd. 1999.

(56) References Cited

OTHER PUBLICATIONS

Soulodre, GA, "Evaluation of Objective Loudness Meters" Preprints of Papers Presented at the 116.sup.th AES Convention, Berlin, Germany, May 8, 2004.
Stevens, "Calculations of the Loudness of Complex Noise," Journal of the Acoustical Society of America, 1956.
Swanson, Mitchell D., et al., "Multiresolution Video Watermarking using Perceptual Models and Scene Segmentation," Department of Electrical and Computer Engineering, University of Minnesota, IEEE, 1997, pp. 558-561.
Todd, et al., "Flexible Perceptual Coding for Audio Transmission and Storage," pp. 1-16 96.sup.th Convention of the Audio Engineering Society, Feb. 26, 1994, Preprint, 3796.
Trapee, W., et al., "Key distribution for secure multimedia multicasts via data embedding," 2001 IEEE International Conferenced on Acoustics, Speech, and Signal Processing. May 7-11, 2001.
Truman, et al., "Efficient Bit Allocation, Quantization, and Coding in an Audio Distribution System," AES Preprint 5068, 107.sup.th AES Conference, Aug. 1999.
Vernon, Steve, "Design and Implementation of AC-3 Coders," IEEE Trans. Consumer Electronics, vol. 41, No. 3, Aug. 1995.
Watson, et al., "Signal Duration and Signal Frequency in Relation to Auditory Sensitivity," Journal of the Acoustical Society of America, vol. 46, No. 4 (Part 2) 1969, pp. 989-997.
Wei, S., et al., "Realization of Dynamic Range Controllers on a Digital Signal Processor for Audio Systems" J. Acoust. Soc. Jpn. (E) 16, 6, 1995.
Zwicker, "Psychological and Methodical Basis of Loudness," Acoustica, 1958.
Zwicker, et al., "Psychoacoustics—Facts and Models," Springer-Verlag, Chapter 8, "Loudness," pp. 203-238, Berlin Heidelberg, 1990, 1999.
Atkinson, I. A., et al., "Time Envelope LP Vocoder: A New Coding Technology at Very Low Bit Rates," 4.sup.th ed., 1995, ISSN 1018-4074, pp. 241-244.
ATSC Standard A52/A: Digital Audio Compression Standard (AC-3), Revision A, Advanced Television Systems Committee, Aug. 20, 2001. The A/52A document is available on the World Wide Web at http://www./atsc.org..sub.--standards.html.
Australian Broadcasting Authority (ABA), "Investigation into Loudness of Advertisements," Jul. 2002.
Ballou, Glen M. "Handbook for Sound Engineers, The New Audio Cyclopedia" 2nd Edition Dynamics, 850-851, Focal Press an imprint of Butterworth-Heinemann, 1998.
Belger, "The Loudness Balance of Audio Broadcast Programs," J. Audio Eng. Soc., vol. 17, No. 3, Jun. 1969, pp. 282-285.
Bertsekas, Dimitri P., "Nonlinear Programming," 1995, Chapter 1.2 "Gradient Methods—Convergence," pp. 18-46.
Bertsekas,. Dimitri P., "Nonlinear Programming," 1995, Chapter 1.8 "Nonderivative Methods,", pp. 142-148.
Blesser, Barry "An Ultra-Miniature Console Compression System with Maximum User Flexibility" presented at the 41st Convention Oct. 5-8, 1971.
Blesser, Barry, "An Ultraminiature Console Compression System with Maximum User Flexibility" Journal of Audio Engineering Society, vol. 20, No. 4, May 1972, pp. 297-302, New York.
Bosi, et al., "High Quality, Low-Rate Audio Transform Coding for Transmission and Multimedia Applications," Audio Engineering Society Preprint 3365, 93.sup.rd AES Convention, Oct. 1992.
Bosi, et al., "ISO/IEC MPEG-2 Advanced Audio Coding," J. Audio Eng. Soc., vol. 45, No. 10, Oct. 1997, pp. 789-814.
Brandenburg, et al., "Overview of MPEG Audio: Current and Future Standards for Low-Bit-Rate Audio Coding," J. Audio eng. Soc., vol. 45, No. 1/2, Jan./Feb. 1997.
Bray, et al.; "An "Optimized" Platform for DSP Hearing Aids," Sonic Innovations, vol. 1 No. 3 1998, pp. 1-4, presented at the Conference on Advanced Signal Processing Hearing Aids, Cleveland, OH, Aug. 1, 1998.
Bray, et al.; "Digital Signal Processing (DSP) Derived from a Nonlinear Auditory Model," Sonic Innovations, vol. 1 No. 1 1998, pp. 1-3, presented at American Academy of Audiology, Los Angeles, CA, Apr. 4, 1998.
Carroll, Tim, "Audio Metadata: You can get there from here", Oct. 11, 2004, pp. 1-4, XP002392570. http://tvtechnology.com/features/audio.sub.--notes/f-TC-metadata-08.21.02-.shtml.
CEI/IEC Standard 60804 published Oct. 2000.
Chalupper, Josef; "Aural Exciter and Loudness Maximizer: What's Psychoacoustic about Psychoacoustic Processors?," Audio Engineering Society (AES) 108.sup.th Convention, Sep. 22-25, 2000, Los Angeles, CA, pp. 1-20.
Cheng-Chieh Lee, "Diversity Control Among Multiple Coders: A Simple Approach to Multiple Descriptions," IEE, September.
Claro Digital Perception Processing; "Sound Processing with a Human Perspective," pp. 1-8.
Crockett, Brett, "High Quality Multichannel Time Scaling and Pitch-Shifting using Auditory Scene Analysis," Audio Engineering Society Convention Paper 5948, New York, Oct. 2003.
Crockett, et al., "A Method for Characterizing and Identifying Audio Based on Auditory Scene Analysis," Audio Engineering Society Convention Paper 6416, 118.sup.th Convention, Barcelona, May 28-31, 2005.
Davis, Mark, "The AC-3 Multichannel Coder," Audio engineering Society, Preprint 3774, 95.sup.th AES Convention, Oct. 1993.
Fielder, et al., "Introduction to Dolby Digital Plus, an Enhancement to the Dolby Digital Coding System," AES Convention Paper 6196, 117.sup.th AES Convention, Oct. 28, 2004.
Fielder, et al., "Professional Audio Coder Optimized fro Use with Video," AES Preprint 5033, 107.sup.th AES Conference, Aug. 1999.
Ghent, Jr., et al.; "Expansion as a Sound Processing Tool in Hearing Aids," American Academy of Audiology National Convention, Apr. 29-May 2, 1999, Miami Beach, FL.
Ghent, Jr., et al.; "Uses of Expansion to Promote Listening Comfort with Hearing Aids," Sonic Innovations, vol. 3 No. 2, 2000, pp. 1-4, presented at American Academy of Audiology 12.sup.th Annual Convention, Chicago, IL, Mar. 16-19, 2000.
Glasberg, et al., "A Model of Loudness Applicable to Time-Varying Sounds," Journal of the Audio Engineering Society, Audio Engineering Society, New York, vol. 50, No. 5, May 2002, pp. 331-342.
Guide to the Use of the ATSC Digital Television Standard, Dec. 4, 2003.
H. H. Scott, "The Amplifier and its Place in the High Fidelity System," J. Audio Eng. Soc., vol. 1, No. 3, Jul. 1953.
Hauenstein M., "A Computationally Efficient Algorithm for Calculating Loudness Patterns of Narrowband Speech," Acoustics, Speech and Signal Processing 1997. 1997 IEEE International Conference, Munich Germany, Apr. 21-24, 1997, Los Alamitos, CA, USA, IEEE Comput. Soc., US, Apr. 21, 1997, pp. 1311-1314.
Hennesand, et al., "Sound Design—Creating the Sound for Complex Systems and Virtual Objects," Chapter II, "Anatomy and Psychoacoustics," 2003-2004.
Hoeg, W. et al."Dynamic Range Control (DRC) and Music/Speech Control (MSC) Programme-Associated Data Services for DAB" EBU Review Technical, European Broadcasting Union, Brussels, BE, No. 261, Sep. 21, 1994, pp. 56-70.
ISO Standard, "Acoustics—Method for calculating loudness level", 532:1975, published 1975.
ISO226 : 1987 (E), "Acoustics—Normal Equal Loudness Level Contours."
Johns, et al.; "An Advanced Graphic Equalizer Hearing Aid: Going Beyond Your Home Audio System," Sonic Innovations Corporation, Mar. 5, 2001, Http://www.audiologvonline.com/articles/pf.sub.--arc.sub.--disp.asp?id=27-9.
Laroche, Jean, "Autocorrelation Method for High-Quality Time/Pitch-Scaling", Final Program and Paper Summaries, 1993 IEEE Workshop on New Paltz, NY. Oct. 17-20, 1993. pp. 131-134.
Li, M., et al., "Wavelet-based Nonlinear AGC Method for Hearing Aid Loudness Compensation" IEE Proc.-Vis. Image Signal Process., vol. 147, No. 6, Dec. 2000.

(56) References Cited

OTHER PUBLICATIONS

Lin, L., et al., "Auditory Filter Bank Design Using Masking Curves," 7.sup.th European Conference on Speech Communications and Technology, Sep. 2001.

Mapes, Riordan, et al., "Towards a model of Loudness Recalibration," 1997 IEEE ASSP workshop on New Paltz, NY USA, Oct. 19-22, 1997.

Martinez G., Isaac; "Automatic Gain Control (AGC) Circuits—Theory and Design," University of Toronto ECE1352 Analog Integrated Circuits 1, Term Paper, Fall 2001, pp. 1-25.

Masciale, John M.; "The Difficulties in Evaluating A—Weighted Sound Level Measurements," S&V Observer, pp. 2-3.

Moore, BCJ, "Use of a loudness model for hearing aid fitting, IV. Fitting hearing aids with multi-channel compression so as to restore "normal" loudness for speech at different levels." British Journal of Audiology, vol. 34, No. 3, pp. 165-177, Jun. 2000, Whurr Publishers, UK.

Moore, et al., "A Model for the Prediction of Thresholds, Loudness and Partial Loudness," Journal of the Audio Engineering Society, Audio Engineering Society, New York, vol. 45, No. 4, Apr. 1997, pp. 224-240.

Moulton, Dave, "Loud, Louder, Loudest!," Electronic Musician, Aug. 1, 2003.

Newcomb, et al., "Practical Loudness: an Active Circuit Design Approach," J. Audio eng. Soc., vol. 24, No. 1, Jan./Feb. 1976.

Nigro, et al., "Concert-Hall Realism through the Use of Dynamic Level Control," J. Audio Eng. Soc., vol. 1, No. 1, Jan. 1953.

Nilsson, et al.; "The Evolution of Multi-channel Compression Hearing Aids," Sonic Innovations, Presented at American Academy of Audiology 13.sup.th Convention, San Diego, CA, Apr. 19-22, 2001.

Painter, Ted, et al. "Perceptual Coding of Digital Audio", Proceedings of the IEEE, vol. 88, No. 4, Apr. 2000.

Park, et al.; "High Performance Digital Hearing Aid Processor with Psychoacoustic Loudness Correction," IEEE FAM P3.1 0-7803-3734-4/97, pp. 312-313.

Riedmiller, Jeff, "Working Toward Consistency in Program Loudness," Broadcast Engineering, Jan. 1, 2004.

\* cited by examiner a) Original signal b) DRC gain c) Signal modified with DRC gain d) Event control signal e) Event-controlled DRC gain f) Signal modified with event-controlled DRC gain a) Original signal b) DRC gain c) Signal modified with DRC gain d) Event control signal e) Event-controlled DRC gain f) Signal modified with event-controlled DRC gain

AUDIO CONTROL USING AUDITORY EVENT DETECTION

CROSS REFERENCE TO RELATED APPLICATIONS

This application is a continuation of U.S. patent application Ser. No. 18/436,667, filed Feb. 8, 2024, which is a continuation of U.S. patent application Ser. No. 18/327,585, filed Jun. 1, 2023, now U.S. Pat. No. 11,962,279, which is a continuation of U.S. patent application Ser. No. 17/839,099, filed Jun. 13, 2022, now U.S. Pat. No. 11,711,060, which is a continuation of U.S. patent application Ser. No. 17/093,178, filed Nov. 9, 2020, now U.S. Pat. No. 11,362,631, which is a continuation of U.S. patent application Ser. No. 16/729,468 filed Dec. 29, 2019, now U.S. Pat. No. 10,833,644, which is a divisional of U.S. patent application Ser. No. 16/365,947 filed on Mar. 27, 2019, now U.S. Pat. No. 10,523,169, which is a continuation of U.S. patent application Ser. No. 16/128,642 filed on Sep. 12, 2018, now U.S. Pat. No. 10,284,159, which is a continuation application of U.S. patent application Ser. No. 15/809,413 filed on Nov. 10, 2017, now U.S. Pat. No. 10,103,700, which is a continuation of U.S. patent application Ser. No. 15/447,564 filed on Mar. 2, 2017, now U.S. Pat. No. 9,866,191, which is a continuation of U.S. patent application Ser. No. 15/238,820 filed on Aug. 17, 2016, now U.S. Pat. No. 9,685,924, which is a continuation of U.S. patent application Ser. No. 13/850,380 filed on Mar. 26, 2013, now U.S. Pat. No. 9,450,551, which is a continuation of U.S. patent application Ser. No. 13/464,102 filed on May 4, 2012, now U.S. Pat. No. 8,428,270, which is a continuation of U.S. patent application Ser. No. 13/406,929 filed on Feb. 28, 2012, now U.S. Pat. No. 9,136,810, which is a continuation of U.S. patent application Ser. No. 12/226,698 filed on Jan. 19, 2009, now U.S. Pat. No. 8,144,881, which is a national application of PCT application No. PCT/US2007/008313 filed Mar. 30, 2007, which claims the benefit of the filing date of U.S. Provisional Patent Application No. 60/795,808 filed on Apr. 27, 2006, all of which are hereby incorporated by reference.

TECHNICAL FIELD

The present invention relates to audio dynamic range control methods and apparatus in which an audio processing device analyzes an audio signal and changes the level, gain or dynamic range of the audio as a function of auditory events. The invention also relates to computer programs for practicing such methods or controlling such apparatus.

BACKGROUND ART

Dynamics Processing of Audio

The techniques of automatic gain control (AGC) and dynamic range control (DRC) are well known and are a common element of many audio signal paths. In an abstract sense, both techniques measure the level of an audio signal in some manner and then gain-modify the signal by an amount that is a function of the measured level. In a linear, 1:1 dynamics processing system, the input audio is not processed and the output audio signal ideally matches the input audio signal. Additionally, if one has an audio dynamics processing system that automatically measures characteristics of the input signal and uses that measurement to control the output signal, if the input signal rises in level by 6 dB and the output signal is processed such that it only rises in level by 3 dB, then the output signal has been compressed by a ratio of 2:1 with respect to the input signal. International Publication Number WO 2006/047600 A1 ("Calculating and Adjusting the Perceived Loudness and/or the Perceived Spectral Balance of an Audio Signal" by Alan Jeffrey Seefeldt) provides a detailed overview of the five basic types of dynamics processing of audio: compression, limiting, automatic gain control (AGC), expansion and gating.

Auditory Events and Auditory Event Detection

The division of sounds into units or segments perceived as separate and distinct is sometimes referred to as "auditory event analysis" or "auditory scene analysis" ("ASA") and the segments are sometimes referred to as "auditory events" or "audio events." An extensive discussion of auditory scene analysis is set forth by Albert S. Bregman in his book *Auditory Scene Analysis—The Perceptual Organization of Sound*, Massachusetts Institute of Technology, 1991, Fourth printing, 2001, Second MIT Press paperback edition). In addition, U.S. Pat. No. 6,002,776 to Bhadkamkar, et al, Dec. 14, 1999 cites publications dating back to 1976 as "prior art work related to sound separation by auditory scene analysis." However, the Bhadkamkar, et al patent discourages the practical use of auditory scene analysis, concluding that "[t]echniques involving auditory scene analysis, although interesting from a scientific point of view as models of human auditory processing, are currently far too computationally demanding and specialized to be considered practical techniques for sound separation until fundamental progress is made."

A useful way to identify auditory events is set forth by Crockett and Crocket et al in various patent applications and papers listed below under the heading "Incorporation by Reference." According to those documents, an audio signal is divided into auditory events, each of which tends to be perceived as separate and distinct, by detecting changes in spectral composition (amplitude as a function of frequency) with respect to time. This may be done, for example, by calculating the spectral content of successive time blocks of the audio signal, calculating the difference in spectral content between successive time blocks of the audio signal, and identifying an auditory event boundary as the boundary between successive time blocks when the difference in the spectral content between such successive time blocks exceeds a threshold. Alternatively, changes in amplitude with respect to time may be calculated instead of or in addition to changes in spectral composition with respect to time.

In its least computationally demanding implementation, the process divides audio into time segments by analyzing the entire frequency band (full bandwidth audio) or substantially the entire frequency band (in practical implementations, band limiting filtering at the ends of the spectrum is often employed) and giving the greatest weight to the loudest audio signal components. This approach takes advantage of a psychoacoustic phenomenon in which at smaller time scales (20 milliseconds (ms) and less) the car may tend to focus on a single auditory event at a given time. This implies that while multiple events may be occurring at the same time, one component tends to be perceptually most prominent and may be processed individually as though it were the only event taking place. Taking advantage of this effect also allows the auditory event detection to scale with the complexity of the audio being processed. For example, if the input audio signal being processed is a solo instrument, the audio events that are identified will likely be the individual notes being played. Similarly for an input voice signal, the individual components of speech, the vowels and consonants for example, will likely be identified as individual audio elements. As the complexity of the audio increases, such as music with a drumbeat or multiple instruments and voice, the auditory event detection identifies the "most prominent" (i.e., the loudest) audio element at any given moment.

At the expense of greater computational complexity, the process may also take into consideration changes in spectral composition with respect to time in discrete frequency subbands (fixed or dynamically determined or both fixed and dynamically determined subbands) rather than the full bandwidth. This alternative approach takes into account more than one audio stream in different frequency subbands rather than assuming that only a single stream is perceptible at a particular time.

Auditory event detection may be implemented by dividing a time domain audio waveform into time intervals or blocks and then converting the data in each block to the frequency domain, using either a filter bank or a time-frequency transformation, such as the FFT. The amplitude of the spectral content of each block may be normalized in order to eliminate or reduce the effect of amplitude changes. Each resulting frequency domain representation provides an indication of the spectral content of the audio in the particular block. The spectral content of successive blocks is compared and changes greater than a threshold may be taken to indicate the temporal start or temporal end of an auditory event.

Preferably, the frequency domain data is normalized, as is described below. The degree to which the frequency domain data needs to be normalized gives an indication of amplitude. Hence, if a change in this degree exceeds a predetermined threshold that too may be taken to indicate an event boundary. Event start and end points resulting from spectral changes and from amplitude changes may be ORed together so that event boundaries resulting from either type of change are identified.

Although techniques described in said Crockett and Crockett at al applications and papers are particularly useful in connection with aspects of the present invention, other techniques for identifying auditory events and event boundaries may be employed in aspects of the present invention.

DISCLOSURE OF THE INVENTION

According to one embodiment, a method for processing an audio signal is disclosed. The, the method includes monitoring a characteristic of the audio signal, identifying a change in the characteristic, establishing an auditory event boundary to identify the change in the characteristic, wherein an audio portion between consecutive auditory event boundaries constitutes an auditory event, and the applying a modification to the audio signal based in part on an occurrence of an auditory event.

In some embodiments, the method operates on an audio signal that includes two or more channels of audio content. In these embodiments, the auditory event boundary is identified by examining changes in the characteristic between the two or more channels of the audio signal. In other embodiments, the audio processing method generates one or more dynamically-varying parameters in response to the auditory event.

Typically, an auditory event is a segment of audio that tends to be perceived as separate and distinct. One usable measure of signal characteristics includes a measure of the spectral content of the audio, for example, as described in the cited Crockett and Crockett et al documents. All or some of the one or more audio dynamics processing parameters may be generated at least partly in response to the presence or absence and characteristics of one or more auditory events. An auditory event boundary may be identified as a change in signal characteristics with respect to time that exceeds a threshold. Alternatively, all or some of the one or more parameters may be generated at least partly in response to a continuing measure of the degree of change in signal characteristics associated with said auditory event boundaries. Although, in principle, aspects of the invention may be implemented in analog and/or digital domains, practical implementations are likely to be implemented in the digital domain in which each of the audio signals are represented by individual samples or samples within blocks of data. In this case, the signal characteristics may be the spectral content of audio within a block, the detection of changes in signal characteristics with respect to time may be the detection of changes in spectral content of audio from block to block, and auditory event temporal start and stop boundaries each coincide with a boundary of a block of data. It should be noted that for the more traditional case of performing dynamic gain changes on a sample-by-sample basis, that the auditory scene analysis described could be performed on a block basis and the resulting auditory event information being used to perform dynamic gain changes that are applied sample-by-sample.

By controlling key audio dynamics processing parameters using the results of auditory scene analysis, a dramatic reduction of audible artifacts introduced by dynamics processing may be achieved.

The present invention presents two ways of performing auditory scene analysis. The first performs spectral analysis and identifies the location of perceptible audio events that are used to control the dynamic gain parameters by identifying changes in spectral content. The second way transforms the audio into a perceptual loudness domain (that may provide more psychoacoustically relevant information than the first way) and identifies the location of auditory events that are subsequently used to control the dynamic gain parameters. It should be noted that the second way requires that the audio processing be aware of absolute acoustic reproduction levels, which may not be possible in some implementations. Presenting both methods of auditory scene analysis allows implementations of ASA-controlled dynamic gain modification using processes or devices that may or may not be calibrated to take into account absolute reproduction levels.

In some embodiments, a method for processing an audio signal in an audio processing apparatus is disclosed. The method includes receiving the audio signal and a parameter, the parameter indicating a location of an auditory event boundary. An audio portion between consecutive auditory event boundaries constitutes an auditory event. The method further includes applying a modification to the audio signal based in part on an occurrence of the auditory event. The audio processing apparatus may be implemented at least in part in hardware and the parameter may be generated by monitoring a characteristic of the audio signal and identifying a change in the characteristic.

In some embodiment, a method for processing an audio signal in an audio processing apparatus is disclosed. The method includes receiving the audio signal. The audio signal may comprise at least one channel of audio content. The audio signal may be divided into a plurality of subband signals with an analysis filterbank. Each of the plurality of subband signals may include at least one subband sample. A characteristic of the audio signal may be derived. The characteristic is a power measure of the audio signal. The power measure may be smoothed to generate a smoothed power measure of the audio signal, wherein the smoothing is based on a low-pass filter. A location of an auditory event boundary may be detected by monitoring the smoothed power measure. An audio portion between consecutive auditory event boundaries may constitute an auditory event. A gain vector may be generated based on the location of the auditory event boundary. The gain vector may be applied to a version of the plurality of subband signals to generate modified subband signals. The modified subband signals may be synthesized with a synthesis filterbank to produce a modified audio signal. The audio processing apparatus can implemented at least in part with hardware.

In some embodiments, the characteristic further includes loudness. The characteristic may include perceived loudness. The characteristic may further include phase. The characteristic may further include a sudden change in signal power. The audio signal may include two or more channels of audio content. The auditory event boundary may be identified by examining changes in the characteristic between the two or more channels. The characteristic may include interchannel phase difference. The characteristic may include interchannel correlation. The auditory event boundary may coincide with a beginning or end of a block of data in the audio signal. The auditory event boundary may be adjusted to coincide with a boundary of a block of data in the audio signal.

Aspects of the present invention are described herein in an audio dynamics processing environment that includes aspects of other inventions. Such other inventions are described in various pending United States and International Patent Applications of Dolby Laboratories Licensing Corporation, the owner of the present application, which applications are identified herein.

BEST MODE FOR CARRYING OUT THE INVENTION

Auditory Scene Analysis (Original, Non-Loudness Domain Method)

Figure 1:
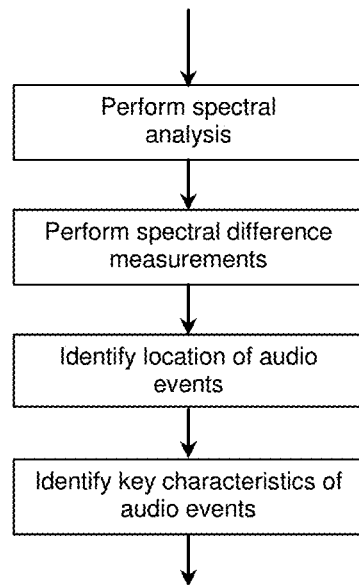
FIG. 1 is a flow chart showing an example of processing steps for performing auditory scene analysis.

In accordance with an embodiment of one aspect of the present invention, auditory scene analysis may be composed of four general processing steps as shown in a portion of FIG. 1. The first step 1-1 ("Perform Spectral Analysis") takes a time-domain audio signal, divides it into blocks and calculates a spectral profile or spectral content for each of the blocks. Spectral analysis transforms the audio signal into the short-term frequency domain. This may be performed using any filterbank, either based on transforms or banks of bandpass filters, and in either linear or warped frequency space (such as the Bark scale or critical band, which better approximate the characteristics of the human ear). With any filterbank there exists a tradeoff between time and frequency. Greater time resolution, and hence shorter time intervals, leads to lower frequency resolution. Greater frequency resolution, and hence narrower subbands, leads to longer time intervals.

The first step, illustrated conceptually in FIG. 1 calculates the spectral content of successive time segments of the audio signal. In a practical embodiment, the ASA block size may be from any number of samples of the input audio signal, although 512 samples provide a good tradeoff of time and frequency resolution. In the second step 1-2, the differences in spectral content from block to block are determined ("Perform spectral profile difference measurements"). Thus, the second step calculates the difference in spectral content between successive time segments of the audio signal. As discussed above, a powerful indicator of the beginning or end of a perceived auditory event is believed to be a change in spectral content. In the third step 1-3 ("Identify location of auditory event boundaries"), when the spectral difference between one spectral-profile block and the next is greater than a threshold, the block boundary is taken to be an auditory event boundary. The audio segment between consecutive boundaries constitutes an auditory event. Thus, the third step sets an auditory event boundary between successive time segments when the difference in the spectral profile content between such successive time segments exceeds a threshold, thus defining auditory events. In this embodiment, auditory event boundaries define auditory events having a length that is an integral multiple of spectral profile blocks with a minimum length of one spectral profile block (512 samples in this example). In principle, event boundaries need not be so limited. As an alternative to the practical embodiments discussed herein, the input block size may vary, for example, so as to be essentially the size of an auditory event.

Following the identification of the event boundaries, key characteristics of the auditory event are identified, as shown in step 1-4.

Figure 2:
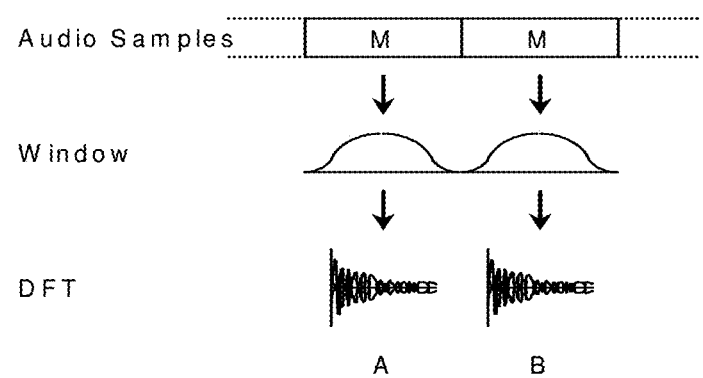
FIG. 2 shows an example of block processing, windowing and performing the DFT on audio while performing the auditory scene analysis.

Either overlapping or non-overlapping segments of the audio may be windowed and used to compute spectral profiles of the input audio. Overlap results in finer resolution as to the location of auditory events and, also, makes it less likely to miss an event, such as a short transient. However, overlap also increases computational complexity. Thus, overlap may be omitted. FIG. 2 shows a conceptual representation of non-overlapping N sample blocks being windowed and transformed into the frequency domain by the Discrete Fourier Transform (DFT). Each block may be windowed and transformed into the frequency domain, such as by using the DFT, preferably implemented as a Fast Fourier Transform (FFT) for speed.

The following variables may be used to compute the spectral profile of the input block:

M=number of windowed samples in a block used to compute spectral profile

P=number of samples of spectral computation overlap

In general, any integer numbers may be used for the variables above. However, the implementation will be more efficient if M is set equal to a power of 2 so that standard FFTs may be used for the spectral profile calculations. In a practical embodiment of the auditory scene analysis process, the parameters listed may be set to:

M=512 samples (or 11.6 ms at 44.1 kHz)

P=0 samples (no overlap)

The above-listed values were determined experimentally and were found generally to identify with sufficient accuracy the location and duration of auditory events. However, setting the value of P to 256 samples (50% overlap) rather than zero samples (no overlap) has been found to be useful in identifying some hard-to-find events. While many different types of windows may be used to minimize spectral artifacts due to windowing, the window used in the spectral profile calculations is an M-point Hanning, Kaiser-Bessel or other suitable, preferably non-rectangular, window. The above-indicated values and a Hanning window type were selected after extensive experimental analysis as they have shown to provide excellent results across a wide range of audio material. Non-rectangular windowing is preferred for the processing of audio signals with predominantly low frequency content. Rectangular windowing produces spectral artifacts that may cause incorrect detection of events. Unlike certain encoder/decoder (codec) applications where an overall overlap/add process must provide a constant level, such a constraint does not apply here and the window may be chosen for characteristics such as its time/frequency resolution and stop-band rejection.

In step 1-1 (FIG. 1), the spectrum of each M-sample block may be computed by windowing the data with an M-point Hanning, Kaiser-Bessel or other suitable window, converting to the frequency domain using an M-point Fast Fourier Transform, and calculating the magnitude of the complex FFT coefficients. The resultant data is normalized so that the largest magnitude is set to unity, and the normalized array of M numbers is converted to the log domain. The data may also be normalized by some other metric such as the mean magnitude value or mean power value of the data. The array need not be converted to the log domain, but the conversion simplifies the calculation of the difference measure in step 1-2. Furthermore, the log domain more closely matches the nature of the human auditory system. The resulting log domain values have a range of minus infinity to zero. In a practical embodiment, a lower limit may be imposed on the range of values; the limit may be fixed, for example −60 dB, or be frequency-dependent to reflect the lower audibility of quiet sounds at low and very high frequencies. (Note that it would be possible to reduce the size of the array to M/2 in that the FFT represents negative as well as positive frequencies).

Step 1-2 calculates a measure of the difference between the spectra of adjacent blocks. For each block, each of the M (log) spectral coefficients from step 1-1 is subtracted from the corresponding coefficient for the preceding block, and the magnitude of the difference calculated (the sign is ignored). These M differences are then summed to one number. This difference measure may also be expressed as an average difference per spectral coefficient by dividing the difference measure by the number of spectral coefficients used in the sum (in this case M coefficients).

Step 1-3 identifies the locations of auditory event boundaries by applying a threshold to the array of difference measures from step 1-2 with a threshold value. When a difference measure exceeds a threshold, the change in spectrum is deemed sufficient to signal a new event and the block number of the change is recorded as an event boundary. For the values of M and P given above and for log domain values (in step 1-1) expressed in units of dB, the threshold may be set equal to 2500 if the whole magnitude FFT (including the mirrored part) is compared or 1250 if half the FFT is compared (as noted above, the FFT represents negative as well as positive frequencies—for the magnitude of the FFT, one is the mirror image of the other). This value was chosen experimentally and it provides good auditory event boundary detection. This parameter value may be changed to reduce (increase the threshold) or increase (decrease the threshold) the detection of events.

Figure 3:
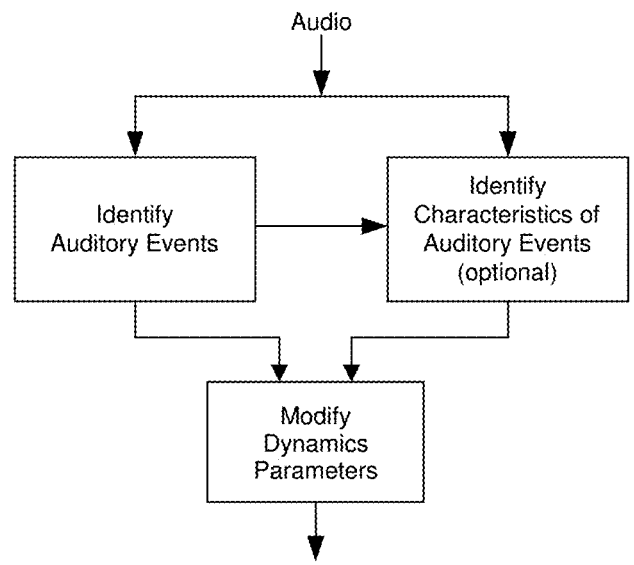
FIG. 3 is in the nature of a flow chart or functional block diagram, showing parallel processing in which audio is used to identify auditory events and to identify the characteristics of the auditory events such that the events and their characteristics are used to modify dynamics processing parameters.
Figure 4:
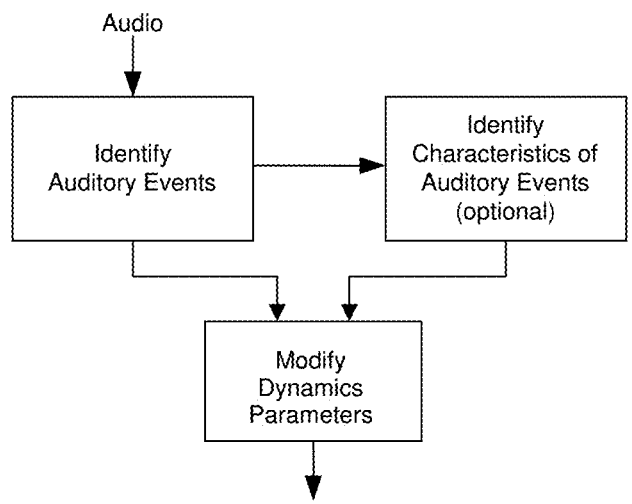
FIG. 4 is in the nature of a flow chart or functional block diagram, showing processing in which audio is used only to identify auditory events and the event characteristics are determined from the audio event detection such that the events and their characteristics are used to modify the dynamics processing parameters.
Figure 5:
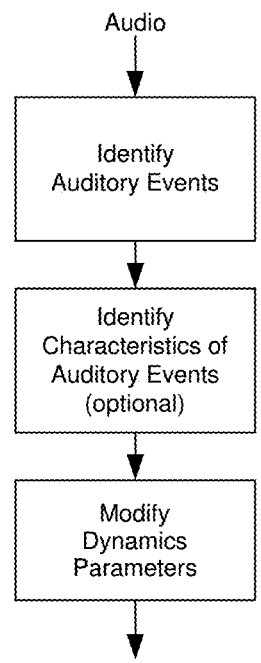
FIG. 5 is in the nature of a flow chart or functional block diagram, showing processing in which audio is used only to identify auditory events and the event characteristics are determined from the audio event detection and such that only the characteristics of the auditory events are used to modify the dynamics processing parameters.

The process of FIG. 1 may be represented more generally by the equivalent arrangements of FIGS. 3, 4 and 5. In FIG. 3, an audio signal is applied in parallel to an "Identify Auditory Events" function or step 3-1 that divides the audio signal into auditory events, each of which tends to be perceived as separate and distinct and to an optional "Identify Characteristics of Auditory Events" function or step 3-2. The process of FIG. 1 may be employed to divide the audio signal into auditory events and their characteristics identified or some other suitable process may be employed. The auditory event information, which may be an identification of auditory event boundaries, determined by function or step 3-1 is then used to modify the audio dynamics processing parameters (such as attack, release, ratio, etc.) , as desired, by a "Modify Dynamics Parameters" function or step 3-3. The optional "Identify Characteristics" function or step 3-3 also receives the auditory event information. The "Identify Characteristics" function or step 3-3 may characterize some or all of the auditory events by one or more characteristics. Such characteristics may include an identification of the dominant subband of the auditory event, as described in connection with the process of FIG. 1. The characteristics may also include one or more audio characteristics, including, for example, a measure of power of the auditory event, a measure of amplitude of the auditory event, a measure of the spectral flatness of the auditory event, and whether the auditory event is substantially silent, or other characteristics that help modify dynamics parameters such that negative audible artifacts of the processing are reduced or removed. The characteristics may also include other characteristics such as whether the auditory event includes a transient.

Alternatives to the arrangement of FIG. 3 are shown in FIGS. 4 and 5. In FIG. 4, the audio input signal is not applied directly to the "Identify Characteristics" function or step 4-3, but it does receive information from the "Identify Auditory Events" function or step 4-1. The arrangement of FIG. 1 is a specific example of such an arrangement. In FIG. 5, the functions or steps 5-1, 5-2 and 5-3 are arranged in series.

The details of this practical embodiment are not critical. Other ways to calculate the spectral content of successive time segments of the audio signal, calculate the differences between successive time segments, and set auditory event boundaries at the respective boundaries between successive time segments when the difference in the spectral profile content between such successive time segments exceeds a threshold may be employed.

Auditory Scene Analysis (New, Loudness Domain Method)

Figure 6:
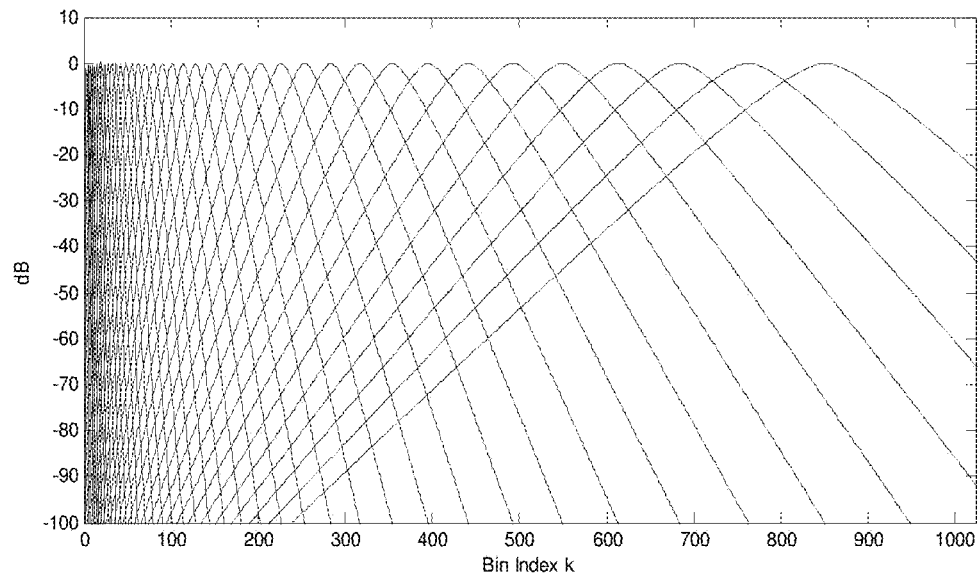
FIG. 6 shows a set idealized auditory filter characteristic responses that approximate critical banding on the ERB scale. The horizontal scale is frequency in Hertz and the vertical scale is level in decibels.

International application under the Patent Cooperation Treaty S.N. PCT/US2005/038579, filed Oct. 25, 2005, published as International Publication Number WO 2006/047600 A1, entitled "Calculating and Adjusting the Perceived Loudness and/or the Perceived Spectral Balance of an Audio Signal" by Alan Jeffrey Seefeldt discloses, among other things, an objective measure of perceived loudness based on a psychoacoustic model. Said application is hereby incorporated by reference in its entirety. As described in said application, from an audio signal, x[n], an excitation signal E[b,t] is computed that approximates the distribution of energy along the basilar membrane of the inner ear at critical band b during time block t. This excitation may be computed from the Short-time Discrete Fourier Transform (STDFT) of the audio signal as follows:

$$E[b, t] = \lambda_b E[b, t-1] + (1 - \lambda_b) \sum_k |T[k]|^2 |C_b[k]|^2 |X[k, t]|^2 \quad (1)$$

where X[k,t] represents the STDFT of x[n] at time block t and bin k. Note that in equation 1 t represents time in discrete units of transform blocks as opposed to a continuous measure, such as seconds. T[k] represents the frequency response of a filter simulating the transmission of audio through the outer and middle ear, and $C_b[k]$ represents the frequency response of the basilar membrane at a location corresponding to critical band b. FIG. 6 depicts a suitable set of critical band filter responses in which 40 bands are spaced uniformly along the Equivalent Rectangular Bandwidth (ERB) scale, as defined by Moore and Glasberg. Each filter shape is described by a rounded exponential function and the bands are distributed using a spacing of 1 ERB. Lastly, the smoothing time constant $\lambda_b$ in equation 1 may be advantageously chosen proportionate to the integration time of human loudness perception within band b.

Figure 7:
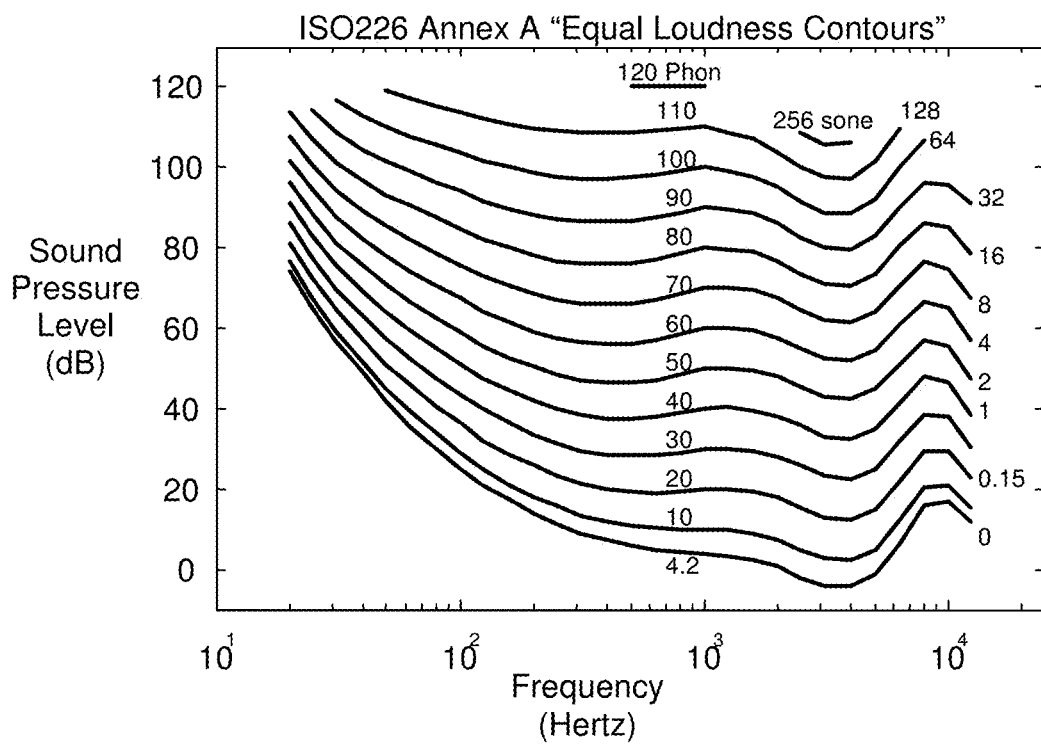
FIG. 7 shows the equal loudness contours of ISO 226. The horizontal scale is frequency in Hertz (logarithmic base 10 scale) and the vertical scale is sound pressure level in decibels.

Using equal loudness contours, such as those depicted in FIG. 7, the excitation at each band is transformed into an excitation level that would generate the same perceived loudness at 1 kHz. Specific loudness, a measure of perceptual loudness distributed across frequency and time, is then computed from the transformed excitation, $E_{1kHz}[b,t]$, through a compressive non-linearity. One such suitable function to compute the specific loudness N[b,t] is given by:

$$N[b, t] = \beta\left(\left(\frac{E_{1kHz}[b, t]}{TQ_{1kHz}}\right)^\alpha - 1\right) \quad (2)$$

where $TQ_{1kHz}$ is the threshold in quiet at 1 kHz and the constants β and α are chosen to match growth of loudness data as collected from listening experiments. Abstractly, this transformation from excitation to specific loudness may be presented by the function Ψ{ } such that:

$$N[b,t] = \Psi\{E[b,t]\}$$

Finally, the total loudness, L[t], represented in units of sone, is computed by summing the specific loudness across bands:

$$L[t] = \sum_b N[b, t] \quad (3)$$

The specific loudness N[b,t] is a spectral representation meant to simulate the manner in which a human perceives audio as a function of frequency and time. It captures variations in sensitivity to different frequencies, variations in sensitivity to level, and variations in frequency resolution. As such, it is a spectral representation well matched to the detection of auditory events. Though more computationally complex, comparing the difference of N[b,t] across bands between successive time blocks may in many cases result in more perceptually accurate detection of auditory events in comparison to the direct use of successive FFT spectra described above.

In said patent application, several applications for modifying the audio based on this psychoacoustic loudness model are disclosed. Among these are several dynamics processing algorithms, such as AGC and DRC. These disclosed algorithms may benefit from the use of auditory events to control various associated parameters. Because specific loudness is already computed, it is readily available for the purpose of detecting said events. Details of a preferred embodiment are discussed below.

Audio Dynamics Processing Parameter Control with Auditory Events

Two examples of embodiments of the invention are now presented. The first describes the use of auditory events to control the release time in a digital implementation of a Dynamic Range Controller (DRC) in which the gain control is derived from the Root Mean Square (RMS) power of the signal. The second embodiment describes the use of auditory events to control certain aspects of a more sophisticated combination of AGC and DRC implemented within the context of the psychoacoustic loudness model described above. These two embodiments are meant to serve as examples of the invention only, and it should be understood that the use of auditory events to control parameters of a dynamics processing algorithm is not restricted to the specifics described below.

Dynamic Range Control

The described digital implementation of a DRC segments an audio signal x[n] into windowed, half-overlapping blocks, and for each block a modification gain based on a measure of the signal's local power and a selected compression curve is computed. The gain is smoothed across blocks and then multiplied with each block. The modified blocks are finally overlap-added to generate the modified audio signal y[n].

It should be noted, that while the auditory scene analysis and digital implementation of DRC as described here divides the time-domain audio signal into blocks to perform analysis and processing, the DRC processing need not be performed using block segmentation. For example the auditory scene analysis could be performed using block segmentation and spectral analysis as described above and the resulting auditory event locations and characteristics could be used to provide control information to a digital implementation of a traditional DRC implementation that typically operates on a sample-by-sample basis. Here, however, the same blocking structure used for auditory scene analysis is employed for the DRC to simplify the description of their combination.

Proceeding with the description of a block based DRC implementation, the overlapping blocks of the audio signal may be represented as:

$$x[n, t] = w[n]x[n + tM/2] \quad \text{for} \quad 0 < n < M - 1 \quad (4)$$

where M is the block length and the hopsize is M/2, w[n] is the window, n is the sample index within the block, and t is the block index (note that here t is used in the same way as with the STDFT in equation 1; it represents time in discrete units of blocks rather than seconds, for example). Ideally, the window w[n] tapers to zero at both ends and sums to unity when half-overlapped with itself; the commonly used sine window meets these criteria, for example.

For each block, one may then compute the RMS power to generate a power measure P[t] in dB per block:

$$P[t] = 10 * \log 10 \left( \frac{1}{M} \sum_{n=1}^{M} x^2[n, t] \right) \quad (5)$$

Figure 8A:
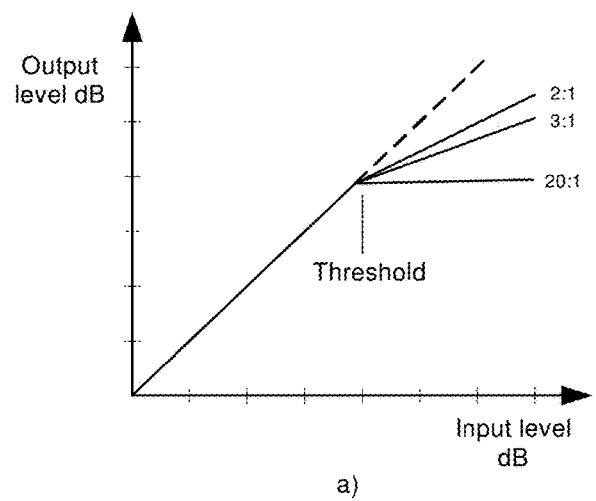
FIGS. 8*a-c* shows idealized input/output characteristics and input gain characteristics of an audio dynamic range compressor.
Figure 8B:
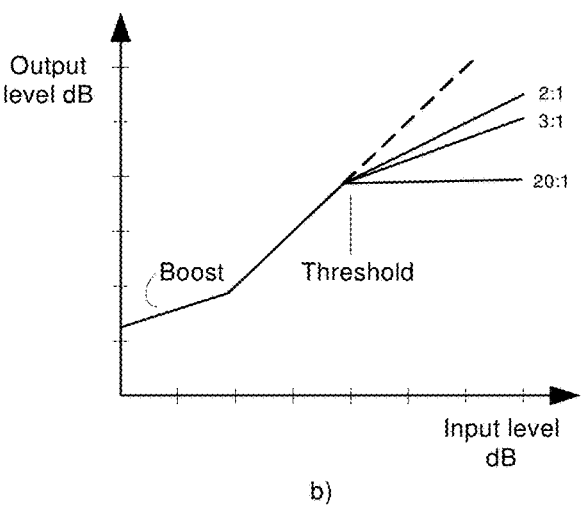
Figure 8C:
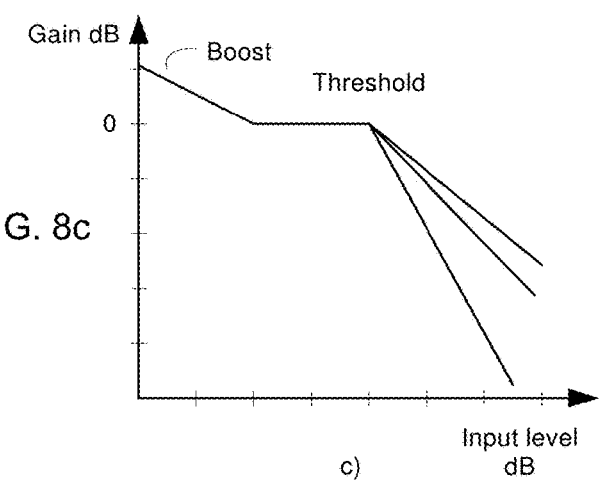

As mentioned earlier, one could smooth this power measure with a fast attack and slow release prior to processing with a compression curve, but as an alternative the instantaneous power P[t] is processed and the resulting gain is smoothed. This alternate approach has the advantage that a simple compression curve with sharp knee points may be used, but the resulting gains are still smooth as the power travels through the knee-point. Representing a compression curve as shown in FIG. 8c as a function F of signal level that generates a gain, the block gain G[t] is given by:

$$G[t] = F\{P[t]\} \quad (6)$$

Assuming that the compression curve applies greater attenuation as signal level increases, the gain will be decreasing when the signal is in "attack mode" and increasing when in "release mode". Therefore, a smoothed gain $\overline{G}[t]$ may be computed according to:

$$\overline{G}[t] = \alpha[t] \cdot \overline{G}[t-1] + (1 - \alpha[t])G[t] \quad (7a)$$

where $$\alpha[t] = \begin{cases} \alpha_{attack} & G[t] < \overline{G}[t-1] \\ \alpha_{release} & G[t] \geq \overline{G}[t-1] \end{cases} \quad (7b)$$

and $$\alpha_{release} \gg \alpha_{attack} \quad (7c)$$

Finally, the smoothed gain $\overline{G}[t]$, which is in dB, is applied to each block of the signal, and the modified blocks are overlap-added to produce the modified audio:

$$y[n + tM/2] = \left(10^{\overline{G}[t]/20}\right)x[n, t] + \left(10^{\overline{G}[t-1]/20}\right)x[n + M/2, t - 1] \quad \text{for} \quad 0 < n < M/2 \quad (8)$$

Note that because the blocks have been multiplied with a tapered window, as shown in equation 4, the overlap-add synthesis shown above effectively smooths the gains across samples of the processed signal y[n]. Thus, the gain control signal receives smoothing in addition to that in shown in equation 7a. In a more traditional implementation of DRC operating sample-by-sample rather than block-by-block, gain smoothing more sophisticated than the simple one-pole filter shown in equation 7a might be necessary in order to prevent audible distortion in the processed signal. Also, the use of block based processing introduces an inherent delay of M/2 samples into the system, and as long as the decay time associated with $\alpha_{attack}$ is close to this delay, the signal x[n] does not need to be delayed further before the application of the gains for the purposes of preventing overshoot.

Figures 9A, 9B, 9C, 9D, 9E, 9F:
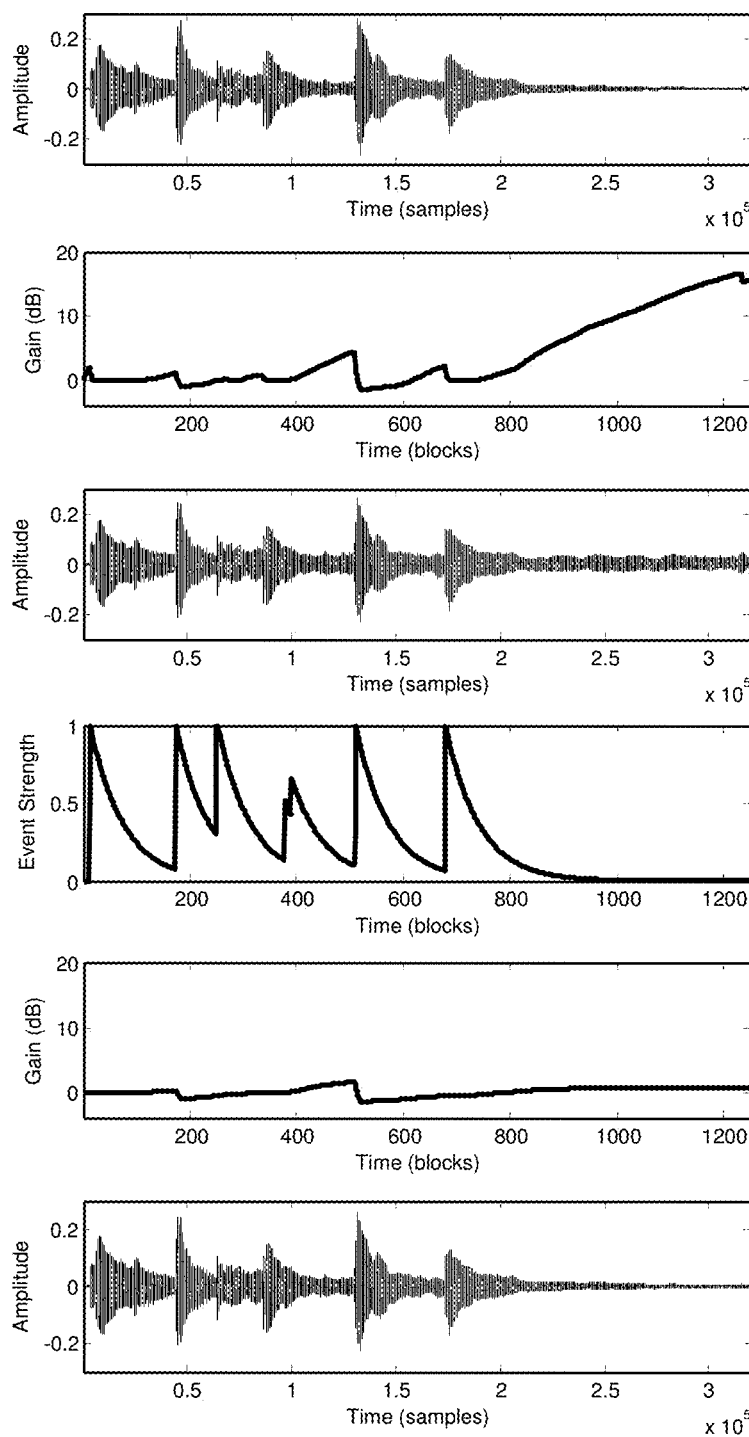
FIGS. 9*a-f* show an example of the use of auditory events to control the release time in a digital implementation of a traditional Dynamic Range Controller (DRC) in which the gain control is derived from the Root Mean Square (RMS) power of the signal.

FIGS. 9a through 9c depict the result of applying the described DRC processing to an audio signal. For this particular implementation, a block length of M=512 is used at a sampling rate of 44.1 KHz. A compression curve similar to the one shown in FIG. 8b is used:
above −20 dB relative to full scale digital the signal is attenuated with a ratio of 5:1, and below
−30 dB the signal is boosted with a ratio of 5:1. The gain is smoothed with an attack coefficient $\alpha_{attack}$ corresponding to a half-decay time of 10 ms and a release coefficient $\alpha_{release}$ corresponding to a half-decay time of 500 ms. The original audio signal depicted in FIG. 9a consists of six consecutive piano chords, with the final chord, located around sample $1.75 \times 10^5$, decaying into silence. Examining a plot of the gain $\overline{G}[t]$ in FIG. 9b, it should be noted that the gain remains close to 0 dB while the six chords are played. This is because the signal energy remains, for the most part, between −30 dB and −20 dB, the region within which the DRC curve calls for no modification. However, after the hit of the last chord, the signal energy falls below −30 dB, and the gain begins to rise, eventually beyond 15 dB, as the chord decays. FIG. 9c depicts the resulting modified audio signal, and one can see that the tail of the final chord is boosted significantly. Audibly, this boosting of the chord's natural, low-level decay sound creates an extremely unnatural result. It is the aim of the present invention to prevent problems of this type that are associated with a traditional dynamics processor.

Figures 10A, 10B, 10C, 10D, 10E, 10F:
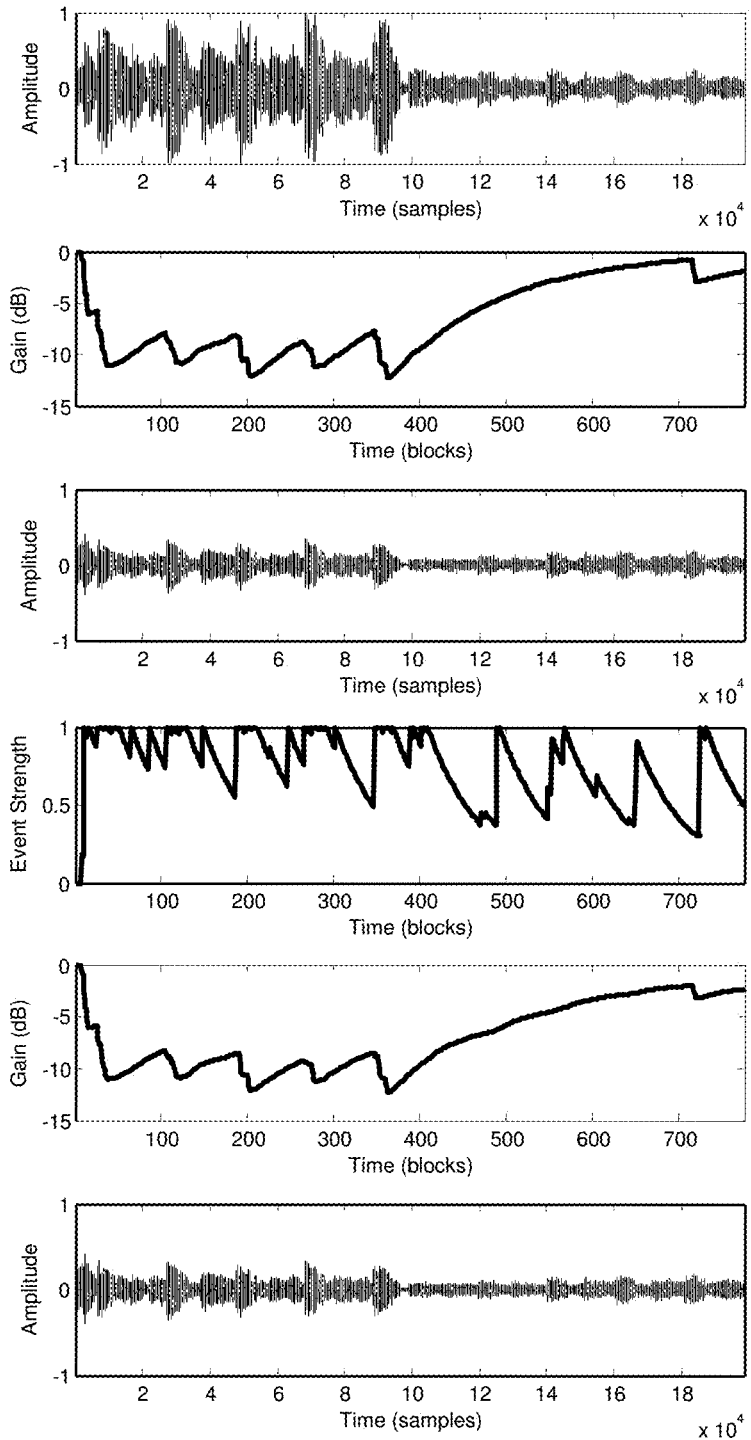
FIGS. 10*a-f* show an example of the use of auditory events to control the release time in a digital implementation of a traditional Dynamic Range Controller (DRC) in which the gain control is derived from the Root Mean Square (RMS) power of the signal for an alternate signal to that used in FIG. 9.

FIGS. 10a through 10c depict the results of applying the exact same DRC system to a different audio signal. In this case the first half of the signal consists of an up-tempo music piece at a high level, and then at approximately sample $10 \times 10^4$ the signal switches to a second up-tempo music piece, but at a significantly lower level. Examining the gain in FIG. 6b, one sees that the signal is attenuated by approximately 10 dB during the first half, and then the gain rises back up to 0 dB during the second half when the softer piece is playing. In this case, the gain behaves as desired. One would like the second piece to be boosted relative to the first, and the gain should increase quickly after the transition to the second piece to be audibly unobtrusive. One sees a gain behavior that is similar to that for the first signal discussed, but here the behavior is desirable. Therefore, one would like to fix the first case without affecting the second. The use of auditory events to control the release time of this DRC system provides such a solution.

In the first signal that was examined in FIG. 9, the boosting of the last chord's decay seems unnatural because the chord and its decay are perceived as a single auditory event whose integrity is expected to be maintained. In the second case, however, many auditory events occur while the gain increases, meaning that for any individual event, little change is imparted. Therefore the overall gain change is not as objectionable. One may therefore argue that a gain change should be allowed only in the near temporal vicinity of an auditory event boundary. One could apply this principal to the gain while it is in either attack or release mode, but for most practical implementations of a DRC, the gain moves so quickly in attack mode in comparison to the human temporal resolution of event perception that no control is necessary. One may therefore use events to control smoothing of the DRC gain only when it is in release mode.

A suitable behavior of the release control is now described. In qualitative terms, if an event is detected, the gain is smoothed with the release time constant as specified above in Equation 7a. As time evolves past the detected event, and if no subsequent events are detected, the release time constant continually increases so that eventually the smoothed gain is "frozen" in place. If another event is detected, then the smoothing time constant is reset to the original value and the process repeats. In order to modulate the release time, one may first generate a control signal based on the detected event boundaries.

As discussed earlier, event boundaries may be detected by looking for changes in successive spectra of the audio signal. In this particular implementation, the DFT of each overlapping block x[n,t] may be computed to generate the STDFT of the audio signal x[n]:

$$X[k, t] = \sum_{n=0}^{M-1} x[n, t] e^{-j\frac{2\pi k n}{M}} \quad (9)$$

Next, the difference between the normalized log magnitude spectra of successive blocks may be computed according to:

$$D[t] = \sum_k |X_{NORM}[k, t] - X_{NORM}[k, t-1]| \quad (10a)$$

where $$X_{NORM}[k, t] = \log\left(\frac{|X[k, t]|}{\max_k\{|X[k, t]|\}}\right) \quad (10b)$$

Here the maximum of $|X[k,t]|$ across bins k is used for normalization, although one might employ other normalization factors; for example, the average of $|X[k,t]|$ across bins. If the difference D[t] exceeds a threshold $D_{min}$, then an event is considered to have occurred. Additionally, one may assign a strength to this event, lying between zero and one, based on the size of D[t] in comparison to a maximum threshold $D_{max}$. The resulting auditory event strength signal A[t] may be computed as:

$$A[t] = \begin{cases} 0 & D[t] \leq D_{min} \\ \frac{D[t] - D_{min}}{D_{max} - D_{min}} & D_{min} < D[t] < D_{max} \\ 1 & D[t] \geq D_{max} \end{cases} \quad (11)$$

By assigning a strength to the auditory event proportional to the amount of spectral change associated with that event, greater control over the dynamics processing is achieved in comparison to a binary event decision. The inventors have found that larger gain changes are acceptable during stronger events, and the signal in equation 11 allows such variable control.

The signal A[t] is an impulsive signal with an impulse occurring at the location of an event boundary. For the purposes of controlling the release time, one may further smooth the signal A[t] so that it decays smoothly to zero after the detection of an event boundary. The smoothed event control signal $\bar{A}[t]$ may be computed from A[t] according to:

$$\bar{A}[t] = \begin{cases} A[t] & A[t] > \alpha_{event}\bar{A}[t-1] \\ \alpha_{event}\bar{A}[t-1] & \text{otherwise} \end{cases} \quad (12)$$

Here $\alpha_{event}$ controls the decay time of the event control signal. FIGS. 9d and 10d depict the event control signal $\bar{A}[t]$ for the two corresponding audio signals, with the half-decay time of the smoother set to 250 ms. In the first case, one sees that an event boundary is detected for each of the six piano chords, and that the event control signal decays smoothly towards zero after each event. For the second signal, many events are detected very close to each other in time, and therefore the event control signal never decays fully to zero.

One may now use the event control signal $\bar{A}[t]$ to vary the release time constant used for smoothing the gain. When the control signal is equal to one, the smoothing coefficient $\alpha[t]$ from Equation 7a equals $\alpha_{release}$, as before, and when the control signal is equal to zero, the coefficient equals one so that the smoothed gain is prevented from changing. The smoothing coefficient is interpolated between these two extremes using the control signal according to:

$$\alpha[t] = \begin{cases} \alpha_{attack} & G[t] < \bar{G}[t-1] \\ \bar{A}[t]\alpha_{release} + (1 - \bar{A}[t]) & G[t] \geq \bar{G}[t-1] \end{cases} \quad (13)$$

By interpolating the smoothing coefficient continuously as a function of the event control signal, the release time is reset to a value proportionate to the event strength at the onset of an event and then increases smoothly to infinity after the occurrence of an event. The rate of this increase is dictated by the coefficient $\alpha_{event}$ used to generate the smoothed event control signal.

FIGS. 9e and 10e show the effect of smoothing the gain with the event-controlled coefficient from Equation 13 as opposed to non-event-controlled coefficient from Equation 7b. In the first case, the event control signal falls to zero after the last piano chord, thereby preventing the gain from moving upwards. As a result, the corresponding modified audio in FIG. 9f does not suffer from an unnatural boost of the chord's decay. In the second case, the event control signal never approaches zero, and therefore the smoothed gain signal is inhibited very little through the application of the event control. The trajectory of the smoothed gain is nearly identical to the non-event-controlled gain in FIG. 10b. This is exactly the desired effect.

Loudness Based AGC and DRC

As an alternative to traditional dynamics processing techniques where signal modifications are a direct function of simple signal measurements such as Peak or RMS power, International Patent Application S.N. PCT/US2005/038579 discloses use of the psychoacoustic based loudness model described earlier as a framework within which to perform dynamics processing. Several advantages are cited. First, measurements and modifications are specified in units of sone, which is a more accurate measure of loudness perception than more basic measures such as Peak or RMS power. Secondly, the audio may be modified such that the perceived spectral balance of the original audio is maintained as the overall loudness is changed. This way, changes to the overall loudness become less perceptually apparent in comparison to a dynamics processor that utilizes a wideband gain, for example, to modify the audio. Lastly, the psychoacoustic model is inherently multi-band, and therefore the system is easily configured to perform multi-band dynamics processing in order to alleviate the well-known cross-spectral pumping problems associated with a wideband dynamics processor.

Although performing dynamics processing in this loudness domain already holds several advantages over more traditional dynamics processing, the technique may be further improved through the use of auditory events to control various parameters. Consider the audio segment containing piano chords as depicted in 27a and the associated DRC shown in FIGS. 10b and c. One could perform a similar DRC in the loudness domain, and in this case, when the loudness of the final piano chord's decay is boosted, the boost would be less apparent because the spectral balance of the decaying note would be maintained as the boost is applied. However, a better solution is to not boost the decay at all, and therefore one may advantageously apply the same principle of controlling attack and release times with auditory events in the loudness domain as was previously described for the traditional DRC.

Figure 11:
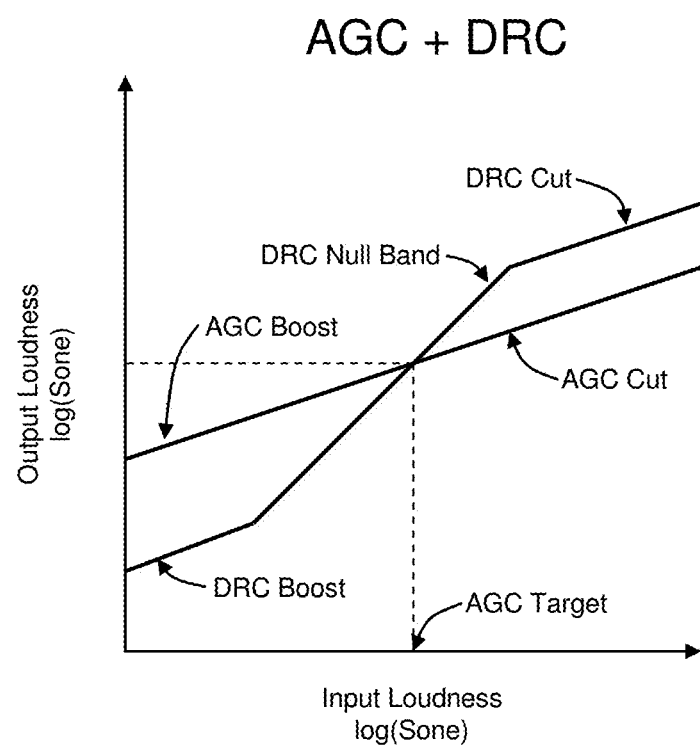
FIG. 11 depicts a suitable set of idealized AGC and DRC curves for the application of AGC followed by DRC in a loudness domain dynamics processing system. The goal of the combination is to make all processed audio have approximately the same perceived loudness while still maintaining at least some of the original audio's dynamics.

The loudness domain dynamics processing system that is now described consists of AGC followed by DRC. The goal of this combination is to make all processed audio have approximately the same perceived loudness while still maintaining at least some of the original audio's dynamics. FIG. 11 depicts a suitable set of AGC and DRC curves for this application. Note that the input and output of both curves is represented in units of sone since processing is performed in the loudness domain. The AGC curve strives to bring the output audio closer to some target level, and, as mentioned earlier, does so with relatively slow time constants. One may think of the AGC as making the long-term loudness of the audio equal to the target, but on a short-term basis, the loudness may fluctuate significantly around this target. Therefore, one may employ faster acting DRC to limit these fluctuations to some range deemed acceptable for the particular application. FIG. 11 shows such a DRC curve where the AGC target falls within the "null band" of the DRC, the portion of the curve that calls for no modification. With this combination of curves, the AGC places the long-term loudness of the audio within the null-band of the DRC curve so that minimal fast-acting DRC modifications need be applied. If the short-term loudness still fluctuates outside of the null-band, the DRC then acts to move the loudness of the audio towards this null-band. As a final general note, one may apply the slow acting AGC such that all bands of the loudness model receive the same amount of loudness modification, thereby maintaining the perceived spectral balance, and one may apply the fast acting DRC in a manner that allows the loudness modification to vary across bands in order alleviate cross-spectral pumping that might otherwise result from fast acting band-independent loudness modification.

Auditory events may be utilized to control the attack and release of both the AGC and DRC. In the case of AGC, both the attack and release times are large in comparison to the temporal resolution of event perception, and therefore event control may be advantageously employed in both cases. With the DRC, the attack is relatively short, and therefore event control may be needed only for the release as with the traditional DRC described above.

As discussed earlier, one may use the specific loudness spectrum associated with the employed loudness model for the purposes of event detection. A difference signal D[t], similar to the one in Equations 10a and b may be computed from the specific loudness N[b,t], defined in Equation 2, as follows:

$$D[t] = \sum_b |N_{NORM}[b, t] - N_{NORM}[b, t-1]| \qquad (14a)$$

where $$N_{NORM}[b, t] = \frac{|N[b, t]|}{\max_b \{N[b, t]\}} \qquad (14b)$$

Here the maximum of |N[b,t]| across frequency bands b is used for normalization, although one might employ other normalization factors; for example, the average of |N[b,t]| across frequency bands. If the difference D[t] exceeds a threshold $D_{min}$, then an event is considered to have occurred. The difference signal may then be processed in the same way shown in Equations 11 and 12 to generate a smooth event control signal $\bar{A}[t]$ used to control the attack and release times.

The AGC curve depicted in FIG. 11 may be represented as a function that takes as its input a measure of loudness and generates a desired output loudness:

$$L_o = F_{AGC}\{L_i\} \qquad (15a)$$

The DRC curve may be similarly represented:

$$L_o = F_{DRC}\{L_i\} \qquad (15b)$$

For the AGC, the input loudness is a measure of the audio's long-term loudness. One may compute such a measure by smoothing the instantaneous loudness L[t], defined in Equation 3, using relatively long time constants (on the order of several seconds). It has been shown that in judging an audio segment's long term loudness, humans weight the louder portions more heavily than the softer, and one may use a faster attack than release in the smoothing to simulate this effect. With the incorporation of event control for both the attack and release, the long-term loudness used for determining the AGC modification may therefore be computed according to:

$$L_{AGC}[t] = \alpha_{AGC}[t]L_{AGC}[t-1] + (1 - \alpha_{AGC}[t])L[t] \quad (16a)$$

where $$\alpha_{AGC}[t] = \begin{cases} \overline{A}[t]\alpha_{AGCattack} + (1 - \overline{A}[t]) & L[t] > L_{AGC}[t-1] \\ \overline{A}[t]\alpha_{AGCrelease} + (1 - \overline{A}[t]) & L[t] \le L_{AGC}[t-1] \end{cases}. \quad (16b)$$

In addition, one may compute an associated long-term specific loudness spectrum that will later be used for the multi-band DRC:

$$N_{AGC}[b, t] = \alpha_{AGC}[t]N_{AGC}[b, t-1] + (1 - \alpha_{AGC}[t])N[b, t] \quad (16c)$$

In practice one may choose the smoothing coefficients such that the attack time is approximately half that of the release. Given the long-term loudness measure, one may then compute the loudness modification scaling associated with the AGC as the ratio of the output loudness to input loudness:

$$S_{AGC}[t] = \frac{F_{AGC}\{L_{AGC}[t]\}}{L_{AGC}[t]} \quad (17)$$

The DRC modification may now be computed from the loudness after the application of the AGC scaling. Rather than smooth a measure of the loudness prior to the application of the DRC curve, one may alternatively apply the DRC curve to the instantaneous loudness and then subsequently smooth the resulting modification. This is similar to the technique described earlier for smoothing the gain of the traditional DRC. In addition, the DRC may be applied in a multi-band fashion, meaning that the DRC modification is a function of the specific loudness N[b,t] in each band b, rather than the overall loudness L[t]. However, in order to maintain the average spectral balance of the original audio, one may apply DRC to each band such that the resulting modifications have the same average effect as would result from applying DRC to the overall loudness. This may be achieved by scaling each band by the ratio of the long-term overall loudness (after the application of the AGC scaling) to the long-term specific loudness, and using this value as the argument to the DRC function. The result is then rescaled by the inverse of said ratio to produce the output specific loudness. Thus, the DRC scaling in each band may be computed according to:

$$S_{DRC}[b, t] = \frac{\frac{N_{AGC}[b, t]}{S_{AGC}[t]L_{AGC}[t]} F_{DRC}\left\{\frac{S_{AGC}[t]L_{AGC}[t]}{N_{AGC}[b, t]} N[b, t]\right\}}{N[b, t]} \quad (18)$$

The AGC and DRC modifications may then be combined to form a total loudness scaling per band:

$$S_{TOT}[b, t] = S_{AGC}[t]S_{DRC}[b, t] \quad (19)$$

This total scaling may then be smoothed across time independently for each band with a fast attack and slow release and event control applied to the release only. Ideally smoothing is performed on the logarithm of the scaling analogous to the gains of the traditional DRC being smoothed in their decibel representation, though this is not essential. To ensure that the smoothed total scaling moves in sync with the specific loudness in each band, attack and release modes may by determined through the simultaneous smoothing of specific loudness itself:

$$\overline{S}_{TOT}[b, t] = \quad (20a)$$

$$\exp(\alpha_{TOT}[b, t]\log(\overline{S}_{TOT}[b, t-1]) + (1 - \alpha_{TOT}[b, t])\log(S_{TOT}[b, t]))$$

$$\overline{N}[b, t] = \alpha_{TOT}[b, t]\overline{N}[b, t-1] + (1 - \alpha_{TOT}[b, t])N[b, t] \quad (20b)$$

where $$\alpha_{TOT}[b, t] = \begin{cases} \alpha_{TOTattack} & N[b, t] > \overline{N}[b, t-1] \\ \overline{A}[t]\alpha_{TOTrelease} + (1 - \overline{A}[t]) & N[b, t] \le \overline{N}[b, t-1] \end{cases} \quad (20c)$$

Finally one may compute a target specific loudness based on the smoothed scaling applied to the original specific loudness $$\hat{N}[b, t] = \overline{S}_{TOT}[b, t]N[b, t] \quad (21)$$

and then solve for gains G[b,t] that when applied to the original excitation result in a specific loudness equal to the target:

$$\hat{N}[b, t] = \Psi\{G^2[b, t]E[b, t]\} \quad (22)$$

The gains may be applied to each band of the filterbank used to compute the excitation, and the modified audio may then be generated by inverting the filterbank to produce a modified time domain audio signal.

Additional Parameter Control

While the discussion above has focused on the control of AGC and DRC attack and release parameters via auditory scene analysis of the audio being processed, other important parameters may also benefit from being controlled via the ASA results. For example, the event control signal $\overline{A}[t]$ from Equation 12 may be used to vary the value of the DRC ratio parameter that is used to dynamically adjust the gain of the audio. The Ratio parameter, similarly to the attack and release time parameters, may contribute significantly to the perceptual artifacts introduced by dynamic gain adjustments.

Implementation

The invention may be implemented in hardware or software, or a combination of both (e.g., programmable logic arrays). Unless otherwise specified, the algorithms included as part of the invention are not inherently related to any particular computer or other apparatus. In particular, various general-purpose machines may be used with programs written in accordance with the teachings herein, or it may be more convenient to construct more specialized apparatus (e.g., integrated circuits) to perform the required method steps. Thus, the invention may be implemented in one or more computer programs executing on one or more programmable computer systems each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such program may be implemented in any desired computer language (including machine, assembly, or high level procedural, logical, or object oriented programming languages) to communicate with a computer system. In any case, the language may be a compiled or interpreted language.

Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

A number of embodiments of the invention have been described. Nevertheless, it will be understood that various modifications may be made without departing from the spirit and scope of the invention. For example, some of the steps described herein may be order independent, and thus may be performed in an order different from that described.

It should be understood that implementation of other variations and modifications of the invention and its various aspects will be apparent to those skilled in the art, and that the invention is not limited by these specific embodiments described. It is therefore contemplated to cover by the present invention any and all modifications, variations, or equivalents that fall within the true spirit and scope of the basic underlying principles disclosed and claimed herein.

INCORPORATION BY REFERENCE

The following patents, patent applications and publications are hereby incorporated by reference, each in their entirety.

Audio Dynamics Processing

Audio Engineer's Reference Book, edited by Michael Talbot-Smith, $2^{nd}$ edition. Limiters and Compressors, Alan Tutton, 2-1492-165. Focal Press, Reed Educational and Professional Publishing, Ltd., 1999.

Detecting and Using Auditory Events

U.S. patent application Ser. No. 10/474,387, "High Quality Time-Scaling and Pitch-Scaling of Audio Signals" of Brett Graham Crockett, published Jun. 24, 2004 as US 2004/0122662 A1.

U.S. patent application Ser. No. 10/478,398, "Method for Time Aligning Audio Signals Using Characterizations Based on Auditory Events" of Brett G. Crockett et al, published Jul. 29, 2004 as US 2004/0148159 A1.

U.S. patent application Ser. No. 10/478,538, "Segmenting Audio Signals Into Auditory Events" of Brett G. Crockett, published Aug. 26, 2004 as US 2004/0165730 A1. Aspects of the present invention provide a way to detect auditory events in addition to those disclosed in said application of Crockett.

U.S. patent application Ser. No. 10/478,397, "Comparing Audio Using Characterizations Based on Auditory Events" of Brett G. Crockett et al, published Sep. 2, 2004 as US 2004/0172240 A1.

International Application under the Patent Cooperation Treaty S.N. PCT/U.S. Ser. No. 05/24630 filed Jul. 13, 2005, entitled "Method for Combining Audio Signals Using Auditory Scene Analysis," of Michael John Smithers, published Mar. 9, 2006 as WO 2006/026161.

International Application under the Patent Cooperation Treaty S.N. PCT/US 2004/016964, filed May 27, 2004, entitled "Method, Apparatus and Computer Program for Calculating and Adjusting the Perceived Loudness of an Audio Signal" of Alan Jeffrey Seefeldt et al, published Dec. 23, 2004 as WO 2004/111994 A2.

International application under the Patent Cooperation Treaty S.N. PCT/US2005/038579, filed Oct. 25, 2005, entitled "Calculating and Adjusting the Perceived Loudness and/or the Perceived Spectral Balance of an Audio Signal" by Alan Jeffrey Seefeldt and published as International Publication Number WO 2006/047600.

"A Method for Characterizing and Identifying Audio Based on Auditory Scene Analysis," by Brett Crockett and Michael Smithers, Audio Engineering Society Convention Paper 6416, $118^{th}$ Convention, Barcelona, May 28-31, 2005.

"High Quality Multichannel Time Scaling and Pitch-Shifting using Auditory Scene Analysis," by Brett Crockett, Audio Engineering Society Convention Paper 5948, New York, October 2003.

"A New Objective Measure of Perceived Loudness" by Alan Seefeldt et al, Audio Engineering Society Convention Paper 6236, San Francisco, Oct. 28, 2004.

*Handbook for Sound Engineers, The New Audio Cyclopedia*, edited by Glen M. Ballou, $2^{nd}$ edition. Dynamics, 850-851. Focal Press an imprint of Butterworth-Heinemann, 1998.

*Audio Engineer's Reference Book*, edited by Michael Talbot-Smith, $2^{nd}$ edition, Section 2.9 ("Limiters and Compressors" by Alan Tutton), pp. 2.149-2.165, Focal Press, Reed Educational and Professional Publishing, Ltd., 1999.

The invention claimed is:

1. A method for processing an audio signal in an audio processing apparatus, the method comprising:
   receiving the audio signal, the audio signal comprising at least two channels of audio content;
   dividing the audio signal into at least a subband signal, wherein the subband signal comprises at least one subband sample, wherein the audio signal is divided into the at least a subband signal using an analysis filter bank;
   deriving a characteristic of the audio signal, wherein the characteristic is a power measure of the audio signal;
   smoothing the power measure to generate a smoothed power measure of the audio signal, wherein the smoothing is based on a low-pass filter;
   detecting a location of an auditory event boundary by monitoring the smoothed power measure, wherein an audio portion between consecutive auditory event boundaries constitutes an auditory event, wherein the detecting further includes applying a threshold to the smoothed power measure to detect the location of the auditory event boundary;

generating a gain vector based on the location of the auditory event boundary;

applying the gain vector to the audio signal to produce modified subband signals;

combining the modified subband signals via a synthesis filterbank to produce a modified audio signal; and wherein the audio processing apparatus is implemented at least in part with hardware.

2. The method of claim 1, wherein the characteristic further includes loudness.

3. The method of claim 1, wherein the characteristic further includes perceived loudness.

4. The method of claim 1, wherein the characteristic further includes phase.

5. The method of claim 1, wherein the characteristic further includes a sudden change in signal power.

6. A non-transitory computer-readable storage medium encoded with a computer program for causing a computer to perform the method of claim 1.

7. An audio processing apparatus, the apparatus comprising:

an input interface for receiving an audio signal, the audio signal comprising at least two channels of audio content;

an analysis filter bank for dividing the audio signal into at least a subband signal, wherein the subband signal comprises at least one subband sample; and a processor that:

derives a characteristic of the audio signal, wherein the characteristic is a power measure of the audio signal;

smooths the power measure to generate a smoothed power measure of the audio signal, wherein the smoothing is based on a low-pass filter;

detects a location of an auditory event boundary by monitoring the smoothed power measure, wherein an audio portion between consecutive auditory event boundaries constitutes an auditory event, wherein the detecting further includes applying a threshold to the smoothed power measure to detect the location of the auditory event boundary;

generates a gain vector based on the location of the auditory event boundary;

applies the gain vector to the audio signal to produce modified subband signals; and synthesizes the modified subband signals via a synthesis filterbank to produce a modified audio signal;

wherein the audio processing apparatus includes at least some hardware.

* * * * *